United States Patent
Sugiura et al.

(10) Patent No.: US 12,021,549 B2
(45) Date of Patent: Jun. 25, 2024

(54) TRANSFORMATION APPARATUS, ENCODING APPARATUS, DECODING APPARATUS, TRANSFORMATION METHOD, ENCODING METHOD, DECODING METHOD, AND PROGRAM

(71) Applicant: NIPPON TELEGRAPH AND TELEPHONE CORPORATION, Tokyo (JP)

(72) Inventors: Ryosuke Sugiura, Tokyo (JP); Takehiro Moriya, Tokyo (JP); Yutaka Kamamoto, Tokyo (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 466 days.

(21) Appl. No.: 17/414,870

(22) PCT Filed: Dec. 9, 2019

(86) PCT No.: PCT/JP2019/047987
§ 371 (c)(1),
(2) Date: Jun. 16, 2021

(87) PCT Pub. No.: WO2020/129718
PCT Pub. Date: Jun. 25, 2020

(65) Prior Publication Data
US 2022/0059106 A1  Feb. 24, 2022

(30) Foreign Application Priority Data

Dec. 21, 2018 (JP) ................. 2018-239814

(51) Int. Cl.
*H03M 5/00* (2006.01)
*H03M 7/30* (2006.01)
*H03M 7/40* (2006.01)

(52) U.S. Cl.
CPC ....... *H03M 7/3062* (2013.01); *H03M 7/4075* (2013.01); *H03M 7/6005* (2013.01);
(Continued)

(58) Field of Classification Search
CPC ............. H03M 7/3062; H03M 7/4075; H03M 7/6005; H03M 7/6011; H03M 7/4006
See application file for complete search history.

(56) References Cited

U.S. PATENT DOCUMENTS

2016/0087647 A1\* 3/2016 Fenney ............... H03M 7/4006
341/67

OTHER PUBLICATIONS

Anonymous (2017) "Unary coding" Wikipedia [online] website: https://en.wikipedia.org/w/index.php?title=UnarLcoding&oldid=801_054359.

(Continued)

*Primary Examiner* — Joseph J Lauture

(57) ABSTRACT

Provided is a technique for converting an integer value sequence for encoding/decoding which allows an integer value sequence having a distribution including small values other than a zero value and greatly biased to small values to be encoded with a small average bit number. Provided are: a unary coding unit which subjects an input sequence of non-negative integer values to unary coding to obtain a unary code sequence; a bit reversing unit which replaces a bit value '0' with a bit value '1' and a bit value '1' with a bit value '0' in the bits in the unary code sequence to obtain a replaced code sequence; and a unary decoding unit which subjects the replaced code sequence to unary decoding to obtain a sequence of non-negative integer values.

15 Claims, 15 Drawing Sheets

(52) U.S. Cl.
 CPC .......... *H03M 7/6011* (2013.01); *H03M 7/30* (2013.01); *H03M 7/4006* (2013.01)

(56) References Cited

OTHER PUBLICATIONS

Anonymous (2018) "Golomb coding" Wikipedia [online] website: https://en.wikipedia.org/w/index.php?title=Golomb_coding&oldid=849527145.

H. S. Malvar, "Adaptive Run-Length/Golomb-Rice Encoding of Quantized Generalized Gaussian Sources with Unknown Statistics," in Proc. Data Compression Conference (DCC) 06, IEEE Computer Society, pp. 23-32, Mar. 2006.

Seishi Takamura, Yoshiyuki Yashima, "Efficient Gaussian Source Coding Based on Distribution Mapping," The Journal of the Institute of Image Information and Television Engineers, vol. 61, No. 9, pp. 1357-1362, 2007.

Ryosuke Sugiura et al. "Optimal Golomb-Rice Code Extension for Lossless Coding of Low-Entropy Exponentially Distributed Sources" IEEE Transactions on Information Theory, vol. 64, No. 4, pp. 3153-3161, Apr. 2018, IEEE Explore Digital Library, Internet: <URL: https://ieeexplore.ieee.org/Xplore/home.jsp>, <URL: https://ieeexplore.ieee.org/document/8272498>, <URL:https://ieeexplore.ieee.org/stamp/stamp.jsp?tp=&arnumber=8 .

* cited by examiner

| INTEGER VALUE | CODE(r=0) | CODE(r=1) | CODE(r=2) |
|---|---|---|---|
| 0 | 0 | 0 0 | 0 00 |
| 1 | 10 | 0 1 | 0 01 |
| 2 | 110 | 10 0 | 0 10 |
| 3 | 1110 | 10 1 | 0 11 |
| 4 | 11110 | 110 0 | 10 00 |
| 5 | 111110 | 110 1 | 10 01 |
| 6 | 1111110 | 1110 0 | 10 10 |
| 7 | 11111110 | 1110 1 | 10 11 |
| 8 | 111111110 | 11110 0 | 110 00 |
| 9 | 1111111110 | 11110 1 | 110 01 |
| : | : | : | : |

Fig.1

| INTEGER VALUE | UNARY CODE |
|---|---|
| 0 | 0 |
| 1 | 10 |
| 2 | 110 |
| 3 | 1110 |
| 4 | 11110 |
| 5 | 111110 |
| 6 | 1111110 |
| 7 | 11111110 |
| 8 | 111111110 |
| 9 | 1111111110 |
| : | : |

Fig. 4

| INTEGER VALUE | UNARY CODE |
|---|---|
| 0 | 1 |
| 1 | 01 |
| 2 | 001 |
| 3 | 0001 |
| 4 | 00001 |
| 5 | 000001 |
| 6 | 0000001 |
| 7 | 00000001 |
| 8 | 000000001 |
| 9 | 0000000001 |
| : | : |

Fig. 7

TRANSFORMATION APPARATUS, ENCODING APPARATUS, DECODING APPARATUS, TRANSFORMATION METHOD, ENCODING METHOD, DECODING METHOD, AND PROGRAM

CROSS-REFERENCE TO RELATED APPLICATIONS

This application is a U.S. 371 Application of International Patent Application No. PCT/JP2019/047987, filed on Dec. 9, 2019, which application claims priority to and the benefit of JP Application No. 2018-239814, filed on Dec. 21, 2018, the disclosures of which are hereby incorporated herein by reference in their entireties.

TECHNICAL FIELD

The present invention relates to encoding and decoding of a sample sequence including integer values, such as a sample sequence of time series digital signals of speech or audio, and to conversion of an integer value sequence for encoding and decoding.

BACKGROUND ART

As a technique for encoding a sample sequence for the purpose of compression, finite precision values (hereinafter referred to as integer values) obtained by quantizing sample values are reversibly encoded to reduce the bit length used for describing the sample sequence. In this technique, which code is to be assigned to which integer value is directly linked to the compression performance. This fact applies, without exception, to any engineering applications for encoding or decoding a sample sequence, such as image encoding for encoding and decoding a sample sequence of image signals, or acoustic encoding for encoding and decoding a sample sequence of acoustic signals.

In general, in variable-length reversible encoding, the configuration of codes to be assigned to integer values is under constraints due to decodability constraints. Specifically, the encoding is under constraints in which, when a short code is assigned to an integer value, a long code must be assigned to another integer value in order for a code to be decodable. Therefore, in order to improve the compression performance, the configuration of codes (assignment of codes to integer values) must be appropriate for the distribution of values in the sequence of integer values. Specifically, when a short code is assigned to an integer value with a high probability of occurrence and a long code is assigned to an integer value with a low probability of occurrence, the expected value of the bit length after compression of an integer value sequence can be reduced.

One of the simplest variable-length coding used in the reversible encoding described above is Golomb coding. It is known that a minimum expected bit length (minimum bit length) is achieved by Golomb coding when a sequence of integer values belongs to an exponential distribution; in other words, when the probability of occurrence of an integer value is exponentially low relative to the magnitude of the value.

Golomb coding is widely used because of its quite simple configuration. For example, Golomb coding is used to encode a sequence of the absolute values of integer values obtained by dividing, by a quantized value, sample values included in a sequence such as a sequence obtained by AD-converting acoustic signals into a PCM form or Fourier-transforming the sequence into a frequency spectrum. Alternatively, Golomb coding may be used to encode a sequence of non-negative integer values obtained by replacing the sample values x of the sequence of integer values by x' obtained by the following Expression (1).

[Math. 1]

$$x' = \begin{cases} 2|x| - 1 & (\text{if } x > 0) \\ 2|x| & (\text{otherwise}) \end{cases} \quad (1)$$

Therefore, the case of encoding and decoding non-negative integer values will be described in the following, while since all integer values can be converted to non-negative integer values on a one-to-one basis for example with Expression (1) as described above, all integer values may be converted into non-negative integer values with Expression (1) in the stage preceding encoding processing, or non-negative integer values can be converted to all integer values for example with inversion of Expression (1) in the stage following decoding processing, so that the technique can be adapted to encoding and decoding of all the integer values.

According to Golomb coding, a code for an input x of a non-negative integer value increases by 1 bit every time the value of the input x increases by s according to the value of the Golomb parameter s, so that an approximately optimal expected bit length is given for a sequence of non-negative integer values according to an exponential distribution (one-sided Laplace distribution) in Expression (2) below.

[Math. 2]

$$P\left(x, 2^{\frac{1}{s}}\right) = \left(1 - 2^{\frac{1}{s}}\right) \cdot 2^{\frac{x}{s}} \quad (2)$$

Note however that the Golomb parameter s is a natural number. In other words, when the Golomb parameter s is a small natural number, a sequence with a large value bias can be encoded with a fewer average bit number, and when s is a large natural number, a sequence with a small value bias can be encoded with a fewer average bit number. A Golomb code, for which s is a power of 2, is particularly called Golomb-Rice code. The Golomb-Rice code, specifically, is obtained when a Rice parameter, which is a non-negative integer value, is r, and the Golomb parameter $s=2^r$. FIG. 1 illustrates examples of the Golomb-Rice codes.

However, while in an actual distribution of a sequence of input non-negative integer values, s can be an arbitrary real number value greater than zero in Expression (2), a Golomb code cannot have a Golomb parameter s that is less than 1. For r which satisfies $s=2^r$, r can be an arbitrary real number value in an actual distribution of an input non-negative integer sequence, while a Golomb-Rice code cannot have a negative value for the Rice parameter r. Therefore, as the bias of the values of a sequence, such as a sequence of values according to a distribution $p(x, 2^{-2})$, becomes larger than a distribution $p(x, 2^{-1})$, the compression efficiency decreases regardless of how the Golomb parameter s and the Rice parameter r are set.

For example, when an acoustic signal is AD-converted into a PCM format, the range of representable numerical values is set so that a large volume sound can be recorded, and so values included in most signal sequences tend to bias to where the absolute values of the range of representable numerical values are small. In particular, a speech signal has a time interval with no utterances, the values are biased to a zero value or a very small value only with background noise. A sequence of integer values obtained by dividing values included in such a signal sequence by a quantization value is biased to even smaller values including a zero value than the original sequence because of the quantization.

A prior art method for encoding a sequence of integer values biased to a zero value is known from NPL 1. According to NPL 1, zero values included in an input integer value sequence are encoded using a fixed bit number with a predetermined number of consecutive zero values, and as for the values other than the zero values included in the input sequence of integer values, the value obtained by subtracting 1 from the value (value−1) is subjected to Golomb-Rice coding.

As a prior art technique for encoding a sequence of integer values biased to small values including zero values is known from NPL 2. According to NPL 2, a pair of two integer values and a single integer value are linked in advance in a bijection manner, the pair of the two integer values included in a sequence of integer values is converted into the single integer value, and then the sequence of integer values after the conversion is subjected to Golomb-Rice coding.

CITATION LIST

Non Patent Literature

[NPL 1] H. S. Malvar, "Adaptive Run-Length/Golomb-Rice Encoding of Quantized Generalized Gaussian Sources with Unknown Statistics," in Proc. Data Compression Conference (DCC) 06, IEEE Computer Society, pp. 23-32, March 2006.

[NPL 2] Seishi Takamura, Yoshiyuki Yashima, "Efficient Gaussian Source Coding Based on Distribution Mapping," The Journal of the Institute of Image Information and Television Engineers, Vol. 61, No. 9, pp. 1357-1362, 2007.

SUMMARY OF THE INVENTION

Technical Problem

According to NPL 1, zero values can be encoded with a small average bit number. However, according to NPL 1, substantially the same encoding as Golomb-Rice coding is performed to the values other than the zero values, and therefore NPL 1 is disadvantageous in that the compression performance is reduced when the small values other than the zero values are biased more greatly than a distribution $p(x, 2^{-1})$.

Also, NPL 1 is not an encoding method corresponding to a mathematically expressed distribution. Therefore, according to NPL 1, when the distribution of values in a sequence of integer values is known, it is still difficult to know which bit number should be selected to represent the number of consecutive zero values to achieve encoding with a small average bit number.

Meanwhile, according to NPL 2, a sequence of integer values more biased than the distribution $p(x, 2^{-1})$ can be encoded with a small average bit number. However, NPL 2 is disadvantageous in that an average bit number for one integer value cannot be smaller than 0.5, and the compression performance is reduced for a greatly biased sequence of integer values for which a theoretically optimal average bit number is less than 0.5.

It is therefore an object of the present invention to provide a technique for converting a sequence of integer values for encoding/decoding which allows for encoding of a sequence of integer values including a small value other than a zero value and having a distribution greatly biased to the small value with a small average bit number.

Means for Solving the Problem

In the conversion according to the present invention, a sequence of non-negative integer values before being subjected to variable-length reversible integer encoding such as Golomb coding or a sequence of non-negative integer values obtained by variable-length reversible integer decoding such as Golomb decoding is subjected to unary coding, the '0' and '1' of the code sequence obtained by the unary coding are bit-reversed, and the resulting sequence is subjected to unary decoding, so that a sequence of non-negative integer values after the conversion is obtained.

Here, the unary coding is based on the rule under which a non-negative integer value and a code formed by combining bit values '1' as many as the non-negative integer value and one bit value '0' are associated, so that for example when the non-negative integer value is '0', the code is '0', when the non-negative integer value is 1, the code is '10', and when the non-negative value is 2, the code is '110'. More specifically, the unary coding is processing for obtaining a code sequence based on a unary code corresponding to each of non-negative integer values included in an input non-integer value sequence. The unary decoding is processing for obtaining a sequence of non-negative integer values corresponding to unary codes included in an input code sequence.

The variable-length reversible encoding such as Golomb coding used in integer encoding or decoding is a variable-length reversible encoding, the bit number of a code corresponding to a non-negative integer value is monotonically non-decreasing with respect to the non-negative integer value. In other words, the variable-length reversible integer encoding such as Golomb coding is processing for obtaining a code for an input non-negative integer value on the basis of the rule of variable-length reversible encoding under which codes with the same bit number may be assigned to multiple non-negative integer values, but a code with a smaller bit number is not assigned to a larger non-negative integer value among the multiple non-negative integer values. The variable-length reversible integer decoding such as Golomb decoding is processing for obtaining a non-negative integer value corresponding to an input code on the basis of the rule of variable-length reversible decoding under which different non-negative integer values may be obtained from multiple codes with the same bit number but a non-negative integer value obtained from a code with a larger bit number among multiple codes with different bit numbers is always larger than a non-negative integer value obtained from a code with a smaller bit number.

Alternatively, in the conversion according to the present invention, a sequence of non-negative integer values before being subjected to variable-length reversible integer encoding such as Golomb coding or a sequence of non-negative integer values obtained by variable-length reversible integer decoding such as Golomb decoding is subjected to unary coding, the resulting code sequence is subjected to unary decoding based on the rule under which the '0' and '1' are bit-reversed, so that a sequence of non-negative integer values after the conversion is obtained. As for the rule of unary coding, under the bit reversing rule for reversing '0' and '1', a non-negative integer value and a code formed by combining bit values '0' as many as the non-negative integer value and one bit value '1' are associated, so that for example when the non-negative integer value is 0, the code is '1', when the non-negative integer value is 1, the code is '01', and when the non-negative integer value is 2, the code is '001'.

Effects of the Invention

According to the present invention, an integer value sequence including a small value other than a zero value and greatly biased to small value, a sequence of integer values which are too biased to be addressed by the technique according to NPL 2 can be encoded with a small average bit number by converting processing according to the present invention followed by encoding. A code obtained by such encoding can be decoded and then subjected to the converting processing according to the present invention, so that the original integer value sequence can be obtained.

BRIEF DESCRIPTION OF DRAWINGS

FIG. 1 illustrates examples of Golomb-Rice codes for non-negative integer values.

FIG. 4 illustrates examples of unary codes for non-negative integer values.

FIG. 7 illustrates unary codes according to a rule under which bit values are reversed from those of the unary codes in FIG. 4.

DESCRIPTION OF EMBODIMENTS

Figure 2:
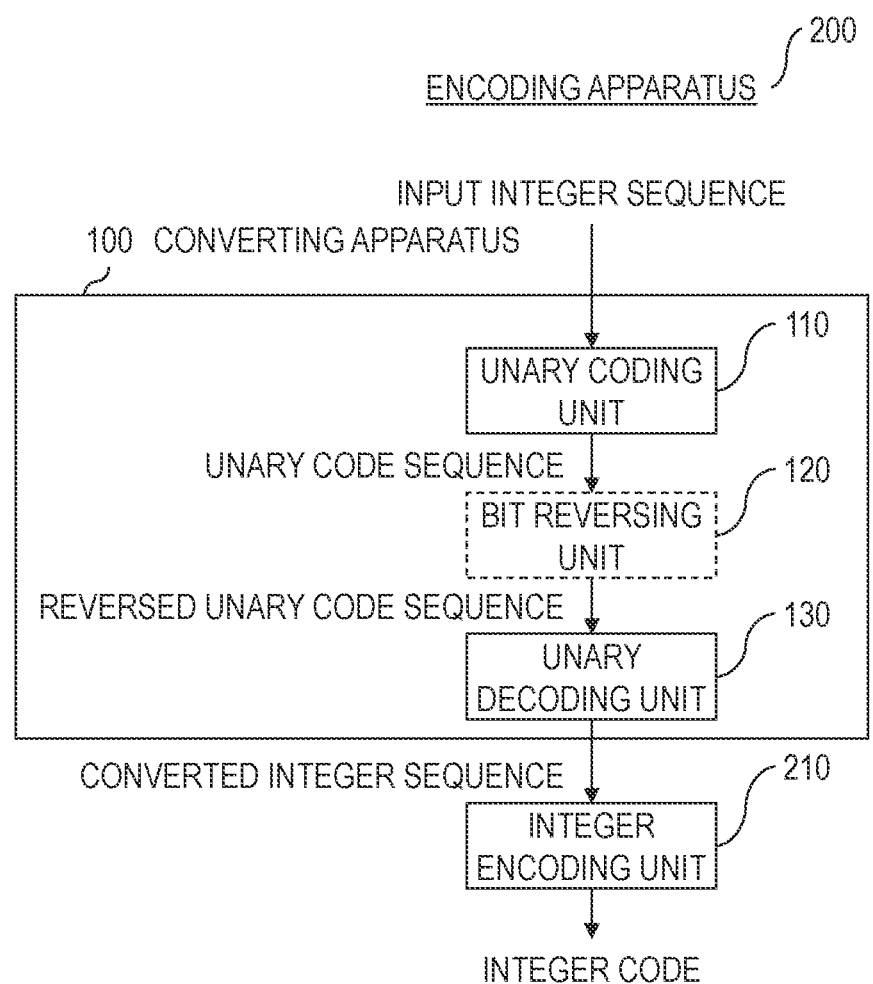
FIG. 2 is a block diagram of an exemplary configuration of an encoding apparatus 200 according to a first embodiment.

Hereinafter, embodiments of the invention will be described in detail. Components having the same functions are designated by the same reference characters and the same description will not be provided.

First Embodiment

<<Encoding Apparatus>>

Figure 3:
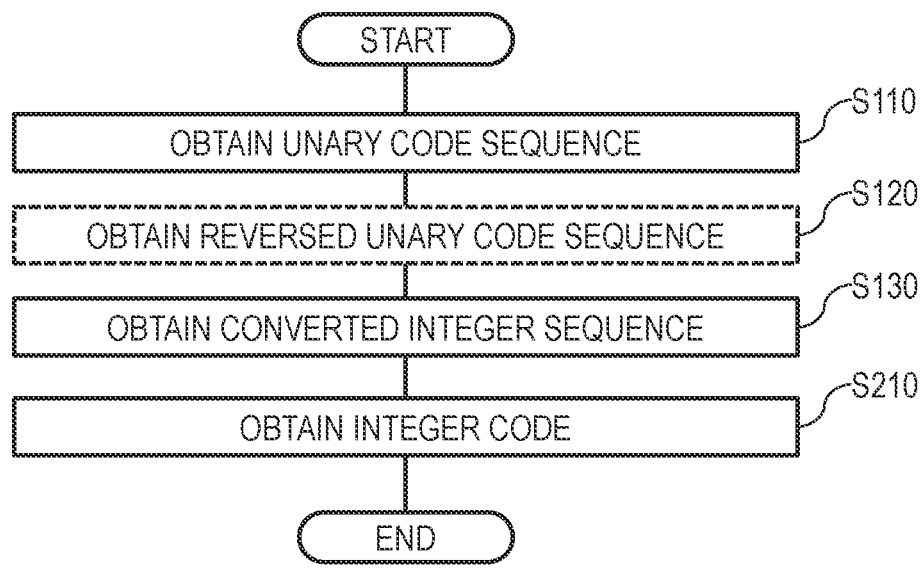
FIG. 3 is a flowchart for illustrating exemplary operation by the encoding apparatus 200 according to the first embodiment.

Referring to FIGS. 2 and 3, the procedure of processing in an encoding method performed by an encoding apparatus 200 according to a first embodiment including a converting apparatus 100 according to the invention will be described. As shown in FIG. 2, the encoding apparatus 200 according to the first embodiment includes a converting apparatus 100 and an integer encoding unit 210. The converting apparatus 100 includes a unary coding unit 110, a bit reversing unit 120, and a unary decoding unit 130. The encoding method according to the first embodiment including the converting method according to the invention is realized as the encoding apparatus 200 according to the first embodiment performs processing in the steps illustrated in FIG. 3.

A sequence of non-negative integer values is input to the encoding apparatus 200 according to the first embodiment. As the sequence of non-negative integer values, a sequence of the absolute values of integer values obtained, for example, by quantizing some or all of digital signals obtained by converting speech or music collected by a microphone or images or video images captured by a camera to a finite precision value by existing techniques, or a sequence of x' obtained by Expression (1) where x represents the integer value may be input.

The encoding apparatus 200 according to the first embodiment achieves encoding processing by which a sequence of integer values, that is, a sequence of non-negative integer values with a distribution with a larger bias than a distribution assumed by integer encoding such as Golomb coding and Golomb-Rice coding, input to the encoding apparatus 200 is subjected to conversion by the converting apparatus 100, the converted integer value sequence is obtained, and the converted integer value sequence is subjected to integer encoding to end up having a shorter bit length than when the sequence of integer values is directly integer-encoded without using the converting apparatus 100. Hereinafter, a non-negative integer value input in the encoding apparatus 200 will be referred simply as an "integer value."

[Unary Coding Unit 110]

A sequence of integer values for each N samples (N: a natural number) (hereinafter referred to as an "input integer sequence") from a sequence of integer values input to the encoding apparatus 200 is input to the unary coding unit 110. The unary coding unit 110 subjects the input integer sequence to unary coding to obtain a unary code sequence for the input integer sequence, and outputs the obtained unary code sequence to the bit reversing unit 120 (step S110).

A unary code sequence is obtained as the unary coding unit 110 obtains unary codes for $x_i$ when $i=1, \ldots, N$ or codes each including $x_i$ bit values '1' and one bit value '0' and connects the obtained unary codes. FIG. 4 shows integer values and unary codes corresponding to the integer values.

[Bit Reversing Unit 120]

The bit reversing unit 120 receives the unary code sequence output by the unary coding unit 110, replaces a bit value '0' with a bit value '1' and a bit value '1' with a bit value '0' in the bits in the unary code sequence to obtain a replaced code sequence (hereinafter referred to as the reversed unary code sequence), and outputs the obtained reversed unary code sequence to the unary decoding unit 130 (step S120).

[Unary Decoding Unit 130]

The unary decoding unit 130 receives the reversed unary code sequence output by the bit reversing unit 120, subjects the reversed unary code sequence to unary decoding to obtain a sequence of integer values (hereinafter referred to as a converted integer sequence), and outputs the resulting converted integer sequence to the integer encoding unit 210 (step S130).

The unary decoding is executed as the unary decoding unit 130 sequentially reads the reversed unary code sequence until the bit value '0' appears, obtains the number of bit values '1' appearing up to the point as an integer value, and repeats the processing from the start to the end of the reversed unary code sequence. Note that the unary decoding unit 130 exceptionally obtains the number of bit values '1' appearing between the bit where an immediately previous integer value is obtained and the bit at the end only when the unary decoding unit 130 has read the reversed unary code sequence to the bit at the end.

Alternatively, the unary decoding may be executed as the unary decoding unit 130 first adds the bit value '0' to the end of the reversed unary code sequence, then sequentially reads the reversed unary code sequence with a bit value '0' added until the bit value '0' appears, and then obtains the number of bit values '1' which appear in-between as an integer value, and repeats the processing from the start to the end of the reversed unary code sequence with a bit value '0' added.

[Integer Encoding Unit 210]

The integer encoding unit 210 receives the converted integer sequence output by the unary decoding unit 130, obtains an integer code by subjecting the converted integer sequence to variable-length reversible encoding such as Golomb coding and outputs the obtained integer code (step S210).

The variable-length reversible encoding performed by the integer encoding unit 210 is processing for obtaining an integer code corresponding to an input integer value on the basis of a variable-length reversible encoding rule under which codes with the same bit number (codes having the same length) may be assigned to a plurality of non-negative integer values but a code with a smaller bit number (short code) is never assigned to a larger value among the plurality of non-negative integer values similarly to Golomb coding or Golomb-Rice coding. More specifically, the variable-length reversible encoding performed by the integer encoding unit 210 may be variable-length reversible encoding by which a code with a larger bit number (long code) is assigned to a larger integer value similarly to Golomb coding for which the Golomb parameter is 1 or Golomb-Rice coding for which the Rice parameter is 0 or by which codes with the same bit number may be assigned to multiple integer values but a code with a smaller bit number is never assigned to a larger integer value among the multiple integer values, similarly to Golomb coding for which the Golomb parameter is at least 2 or Golomb-Rice coding for which the Rice parameter is at least 1. Stated differently, the variable-length reversible encoding performed by the integer encoding unit 210 can substantially be processing for obtaining an integer code corresponding to an input integer value on the basis of the variable-length reversible encoding rule under which the bit number of the code is monotonically non-decreasing with respect to the integer value.

Note that the code '0' is any one of binary bit values, the code '1' is the other of the binary bit values by way of illustration. Therefore, it is understood that the code '1' may be used instead of the code '0' and vice versa.

[[Example of Encoding Processing]]

In an example of encoding processing in the following description, an input integer sequence is 1, 0, 0, 1, 0, 0, 0, 0, 1, 0, 1, 1, 2, 0, 0, 0 and the integer encoding unit 210 performs Golomb-Rice coding with Rice parameter r=1. First, the unary coding unit 110 subjects an input integer sequence to unary coding to obtain a unary code sequence '10001000001001010110000'. Then, the bit reversing unit 120 replaces the bit value '0' by the bit value '1' and the bit value '1' by the bit value '0' in the unary code sequence '10001000001001010110000' to obtain a reversed unary code sequence '01110111110110101001111'. Then, the unary decoding unit 130 subjects the reversed unary code sequence '01110111110110101001111' to unary decoding to obtain a converted integer sequence 0, 3, 5, 2, 1, 1, 0, 4. Then, the integer encoding unit 210 subjects the converted integer sequence 0, 3, 5, 2, 1, 1, 0, 4 to Golomb-Rice coding with the Rice parameter r=1 to obtain an integer code '00101110110001011001100'.

<<Decoding Apparatus>>

Figure 5:
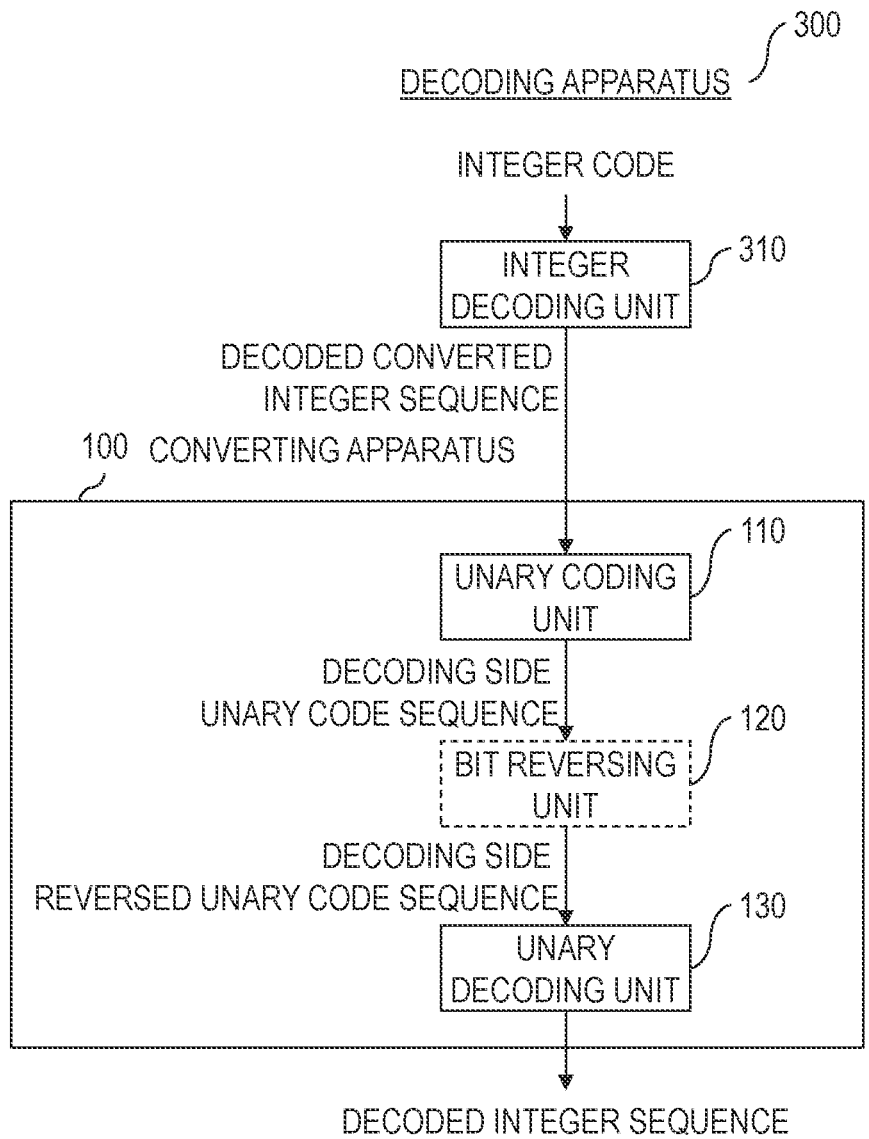
FIG. 5 is a block diagram of an exemplary configuration of a decoding apparatus 300 according to the first embodiment.
Figure 6:
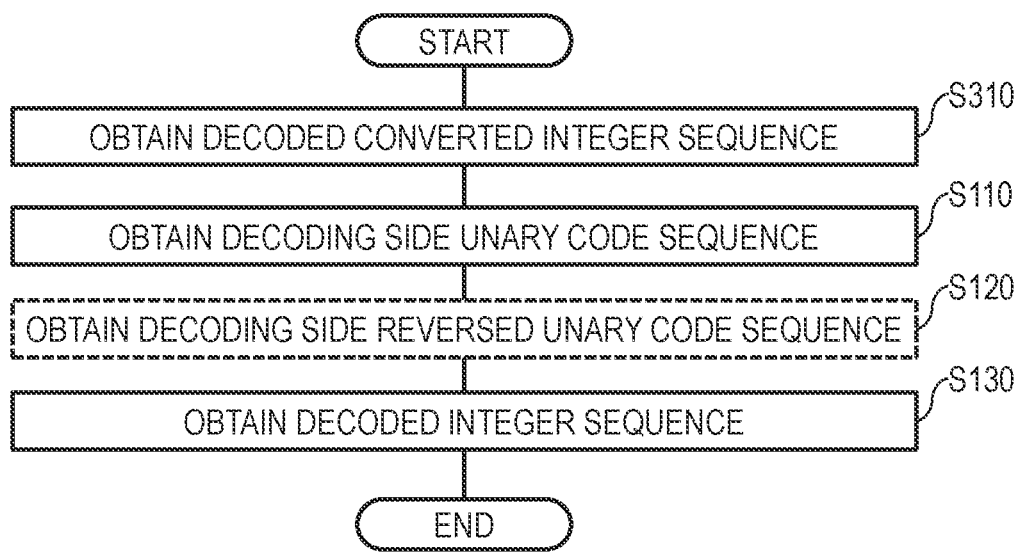
FIG. 6 is a flowchart for illustrating exemplary operation by the decoding apparatus 300 according to the first embodiment.

Referring to FIGS. 5 and 6, the procedure of processing in a decoding method performed by a decoding apparatus 300 according to the first embodiment including the converting apparatus 100 according to the present invention will be described. As shown in FIG. 5, the decoding apparatus 300 according to the first embodiment includes an integer decoding unit 310 and a converting apparatus 100. The converting apparatus 100 includes a unary coding unit 110, a bit reversing unit 120, and a unary decoding unit 130. As the decoding apparatus 300 according to the first embodiment performs the processing in the steps shown in FIG. 6, the decoding method according to the first embodiment including the converting method according to the present invention is carried out.

An integer code output by the encoding apparatus 200 according to the first embodiment is input to the decoding apparatus 300 according to the first embodiment. The decoding apparatus 300 according to the first embodiment regains the exact non-negative integer value sequence input to the encoding apparatus 200 according to the first embodiment by integer-decoding the input integer code to obtain an integer value sequence and converting the integer value sequence obtained by the integer decoding by the converting apparatus 100, so that the converted integer value sequence is obtained. Hereinafter, similarly to the above description of the encoding apparatus 200, a non-negative integer value will be simply referred as an "integer value."

[Integer Decoding Unit 310]

The integer decoding unit 310 receives an integer code input to the decoding apparatus 300, performs variable-length reversible decoding corresponding to the variable-length reversible encoding performed by the integer encoding unit 210 of the encoding apparatus 200 such as Golomb decoding, so that a sequence of integer values is obtained, and outputs the obtained sequence of integer values to the unary coding unit 110 (step S310). The sequence of integer values obtained by the integer decoding unit 310 is a sequence that the exact converted integer sequence input to the integer encoding unit 210 of the encoding apparatus 200 is regained, and therefore, the sequence of integer values obtained by the integer decoding unit 310 will be referred to as a decoded converted integer sequence.

The variable length reversible decoding performed by the integer decoding unit 310 is processing for obtaining an integer value corresponding to an input integer code on the basis of a variable-length reversible decoding rule under which different non-negative integer values may be obtained from a plurality of codes with the same bit number but a non-negative integer value obtained from a code with a larger bit number among a plurality of codes with different bit numbers is always larger than a non-negative integer value obtained from a code with a smaller bit number similarly to Golomb decoding or Golomb-Rice decoding. More specifically, the variable length reversible decoding performed by the integer decoding unit 310 may be variable-length reversible decoding by which a larger integer value is obtained for a code with a larger bit number (a long code) similarly to Golomb decoding with a Golomb parameter of 1 or Golomb-Rice decoding with a Rice parameter of 0 or by which different integer values may be obtained from multiple codes with the same bit number but an integer value obtained from a code with a larger bit number among multiple codes with different bit numbers is always larger than an integer value obtained from a code with a smaller bit number similarly to Golomb decoding with a Golomb parameter of at least 2 or Golomb-Rice decoding with a Rice parameter of at least 1. In the above cases, the variable-length reversible decoding performed by the integer decoding unit 310 must be reversible decoding corresponding to the reversible encoding performed by the integer encoding unit 210 of the encoding apparatus 200. Stated differently, the variable-length reversible decoding performed by the integer decoding unit 310 is substantially processing for obtaining an integer value corresponding to an input integer code on the basis of the variable-length reversible decoding rule, the decoding corresponds to the reversible encoding performed by the integer encoding unit 210 of the encoding apparatus 200, and as for a code and an integer value corresponding to the code, the bit number of the code is monotonically non-decreasing with respect to the integer value.

[Unary Coding Unit 110]

The unary coding unit 110 receives the decoded converted integer sequence output by the integer decoding unit 310, then subjects the decoded converted integer sequence to unary coding to obtain a unary code sequence for the decoded converted integer sequence, and outputs the resulting code sequence (hereinafter referred to as the decoding side unary code sequence) to the bit reversing unit 120 (step S110). The unary coding performed by the unary coding unit 110 of the converting apparatus 100 included in the decoding apparatus 300 is the same as the unary coding performed by the unary coding unit 110 of the converting apparatus 100 included in the encoding apparatus 200.

[Bit Reversing Unit 120]

The bit reversing unit 120 receives the decoding side unary code sequence output by the unary coding unit 110, replaces the bit value '0' by the bit value '1' and the bit value '1' by the bit value '0' in the decoding side unary code sequence to obtain the resulting replaced code sequence (hereinafter referred to as the decoding side reversed unary code sequence) and outputs the decoding side reversed unary code sequence to the unary decoding unit 130 (step S120).

[Unary Decoding Unit 130]

The unary decoding unit 130 receives the decoding side reversed unary code sequence output by the bit reversing unit 120, subjects the decoding side unary code sequence to unary decoding to obtain a sequence of integer values (hereinafter referred to as a decoded integer sequence), and outputs the resulting decoded integer sequence (step S130).

The unary decoding is executed as the unary decoding unit 130 of the converting apparatus 100 included in the decoding apparatus 300 sequentially reads the decoding side reversed unary code sequence until the bit value '0' appears and obtains the number of bit values '1' appearing up to the point as an integer value, and repeats the processing from the start to the end of the decoding side reversed unary code sequence. Since the bit value at the end of the decoding side reversed unary code sequence is '1' and the bit value immediately before the bit value is '0', the unary decoding unit 130 of the converting apparatus 100 included in the decoding apparatus 300 ignores the bit value '1' at the end of the decoding side reversed unary code sequence and performs unary decoding up to the bit value '0' immediately before the bit at the end of the decoding side reversed unary code sequence.

Alternatively, the unary decoding unit 130 may first delete the bit value '1' at the end of the decoding side reversed unary code sequence, then read the decoding side reversed unary code sequence removed of the bit value '1' until the occurrence of the bit value '0' and obtain the number of bit values '1' appearing up to the point as an integer value, and repeats the processing from the start to the end of the decoding side reversed unary code sequence.

Note that the code '0' in the above description is an example of one of binary bit values, and the code '1' described above is the other of the binary bit values. More specifically, it is understood that when, in the encoding apparatus 200, the code '1' is used instead of the code '0' and the code '0' is used instead of the code '1', and the code '1' is used instead of the code '0', and the code '0' may be used instead of the code '1' in the decoding apparatus 300.

[[Example of Decoding Processing]]

As an example of decoding processing, in the following decoding, an input integer code is '0010111011000101001100', and the integer decoding unit 310 performs Golomb-Rice decoding with a Rice parameter r of 1. First, the integer decoding unit 310 subjects the integer code '0010111011000101001100' to Golomb-Rice decoding with a Rice parameter r of 1 to obtain a decoded converted integer sequence 0, 3, 5, 2, 1, 1, 0, 4. Then, the unary coding unit 110 subjects the decoded converted integer sequence 0, 3, 5, 2, 1, 1, 0, 4 to unary coding to obtain a decoding side unary code sequence '01110111110110101010011110'. Then, the bit reversing unit 120 replace the bit value '0' by the bit value '1' and the bit value '1' by the bit value '0' in the decoding side unary code sequence '01110111110110101010011110' to obtain a decoding side reversed unary code sequence '10001000001001010110001'. Then, the unary decoding unit 130 subjects the decoding side reversed unary code sequence '10001000001001010110001' to unary decoding to obtain a decoded integer sequence 1, 0, 0, 1, 0, 0, 0, 0, 1, 0, 1, 1, 2, 0, 0, 0.

<Description of Principle of Invention>

The principle of the present invention will now be described.

The conversion by the converting apparatus 100 according to the invention ensures that an integer sequence according to an exponential distribution largely biased to a particularly small value, i.e., an exponential distribution represented by $p(x, \theta) = (1-\theta)\theta^x$ for a positive number $\theta$ sufficiently smaller than 0.5 can be converted into an integer sequence which can be optimally encoded by Golomb coding. Normally, a Golomb code using a Golomb parameter s assumes an exponential distribution $p(x,\theta)$ with $\theta=2^{-1/s}$ as an input distribution, where s is at least 1, and the compression efficiency is reduced with respect to an exponential distribution with $\theta$ being less than 0.5. However, according to the following principle, the converting apparatus 100 according to the invention performs conversion, so that an integer sequence according to the exponential distribution $p(x, \theta)$ can be converted to an integer sequence according to an exponential distribution $p(x, 1-\theta)$, and as for a distribution with a large bias such that $\theta$ is originally less than 0.5, $(1-\theta)$ is larger than 0.5, and therefore the distribution of the integer sequence can be converted into a distribution with a bias which can be efficiently encoded by Golomb coding.

In the conversion by the converting apparatus 100 according to the present invention, an input integer sequence is first subjected to unary coding. For the unary code obtained by the unary coding, when the integer sequence follows the exponential distribution $p(x, \theta)$, then the probability of occurrence of bit value '1' is $\theta$ and the probability of occurrence of bit value '0' is $(1-\theta)$. The bit value '1' and the bit value '0' in the resulting binary code are permuted, which reverses the probabilities of occurrence of bit values, the probability of occurrence of bit value '1' is (1-0) and the probability of occurrence of the bit value '0' is $\theta$. When the reversed unary code is decoded, the resulting integer sequence follows the exponential distribution $p(x, 1-\theta)$ where $\theta$ is replaced by $(1-\theta)$. Therefore, the converting apparatus 100 according to the present invention allows an integer sequence with a large bias to be converted into an integer sequence with a small bias. More specifically, the input integer sequence can be converted by the converting apparatus 100 according to the present invention and the converted integer sequence can be encoded by integer encoding processing such as Golomb coding, so that an integer sequence with a large bias that cannot be efficiently encoded by Golomb coding can be converted into an integer sequence with a bias within the range that can be efficiently encoded by Golomb coding, and then encoded.

Although, for implementation, unary decoding including exceptional processing is necessary for the end of the code sequence as described in connection with the first embodiment, the integer sequence obtained after two kinds of conversion, that is, a sequence obtained by converting the input integer sequence by the converting apparatus 100 according to the present invention and converting the resulting integer sequence by the converting apparatus 100 according to the present invention becomes the input integer sequence in principle. Therefore, the converting apparatus 100 according to the invention can return an integer sequence with a small bias obtained by conversion by the converting apparatus 100 to the original integer sequence with a large bias. More specifically, when an integer sequence is first obtained from an input integer sequence by integer decoding corresponding to the integer encoding performed on the encoding side and then a decoded integer sequence is obtained by converting the integer sequence obtained by the integer decoding by the converting apparatus 100 according to the present invention, the decoded integer sequence is the same as the integer sequence input on the encoding side.

As in the foregoing, it can be considered that the converting apparatus 100 according to the present invention can reversibly convert the bias of an integer sequence.

When Golomb coding is used in the integer encoding unit 210 and the integer decoding unit 310, a Golomb parameter s' appropriate for Golomb-coding the integer sequence after the conversion by the converting apparatus 100 of the encoding apparatus 200 according to the present invention is obtained by $s'=-1/\log 2(1-2^{-1/s})$ or an approximation thereof $s'=1/s$ from the relation represented by $2^{-1/s}=2^{-1/s'}$ using $\theta=2^{-1/s}$ obtained from the distribution of the original integer sequence before the conversion by the converting apparatus 100 according to the present invention.

As for an integer sequence according to an exponential distribution, increase in the compression efficiency can be ensured theoretically by the conversion as described above. Even for an integer sequence that does not follow an exponential distribution but that follows a distribution in which the probability of occurrence is lower for a larger integer value and the probability of occurrence is higher for a smaller integer value, and which has a large bias in the probability of occurrence, the above described effect will be provided in an approximate manner, and, as a result, the integer sequence can be converted into an integer sequence with a distribution having a lower probability of occurrence for a larger integer value, a higher probability of occurrence for a smaller integer value, and a small bias in the occurrence probability. Therefore, the integer encoding unit 210 may use, in addition to Golomb coding, reversible coding by which its occurrence probability is monotonically non-increasing with respect to integer value and which assumes another non-uniform shape distribution such as Huffman coding by which a code with a larger bit number (a long code) is assigned to a larger integer value.

Even if the distribution of the numerical sequence input to the encoding apparatus 200 does not have the monotonically non-increasing relation as described above, and the distribution of the input numerical sequence is known in advance, it may be possible to approximately convert the bias of the distribution of the numerical sequence by the converting apparatus 100 according to the present invention and encode the sequence as a numerical value converting unit 220, which is not shown, pre-stores numbers 0, 1, 2, . . . in association with possible numerical values to be input in descending order of the probability of occurrence and is provided preceding the converting apparatus 100 in the encoding apparatus 200, the numerical sequence input to the encoding apparatus 200 is converted to a sequence of the numbers described above by the numerical value converting unit 220, and the sequence of numbers after the conversion is encoded by the encoding apparatus 200 as an input integer sequence. As for the decoding apparatus 300, a numerical value inverse converting unit 320, which is not shown, pre-stores the correlation between the numerical values and the numbers which is the same as the numerical value converting unit 220 and is provided succeeding the converting apparatus 100 of the decoding apparatus 300, and the decoding apparatus 300 can obtain the same sequence of numerical values as the numerical sequence input to the encoding apparatus 200 if the decoded integer sequence obtained by the converting apparatus 100 in the decoding apparatus 300 is converted into a sequence of numerical values by the numerical value inverse converting unit 320 as a sequence of the above numbers.

Modification of First Embodiment

According to the first embodiment, the conversion including the combination of the unary coding, the bit reversing processing, and the unary decoding, but the conversion may be performed without the bit reversing processing. A case without the bit reversing processing will be described as a modification of the first embodiment.

<<Encoding Apparatus>>

As shown in FIG. 2, the encoding apparatus 200 according to the modification of the first embodiment includes a converting apparatus 100 and an integer encoding unit 210 similarly to the encoding apparatus 200 according to the first embodiment. The operation of the integer encoding unit 210 of the encoding apparatus 200 according to the modification of the first embodiment is the same as the operation of the integer encoding unit 210 of the encoding apparatus 200 according to the first embodiment. The converting apparatus 100 included in the encoding apparatus 200 according to the modification of the first embodiment does not include the bit reversing unit 120 illustrated by the dashed line in FIG. 2, and includes a unary coding unit 110 and a unary decoding unit 130. When compared with the converting apparatus 100 included in the encoding apparatus 200 according to the first embodiment, the operation of the unary coding unit 110 is the same and the operation of the unary decoding unit 130 is different in the converting apparatus 100 included in the encoding apparatus 200 according to the modification of the first embodiment. Hereinafter, the feature of the encoding apparatus 200 according to the modification of the first embodiment which is different from the encoding apparatus 200 according to the first embodiment will be described.

[Unary Decoding Unit 130]

The unary decoding unit 130 of the converting apparatus 100 included in the encoding apparatus 200 according to the modification of the first embodiment receives a unary code sequence output by the unary coding unit 110, and decodes the unary code sequence on the basis of the rule under which the bit value '0' and the bit value '1' are reversed from those of the unary code from the unary coding unit 110 of the converting apparatus 100 included in the encoding apparatus 200 according to the modification of the first embodiment to obtain a converted integer sequence, and outputs the obtained converted integer sequence to the integer encoding unit 210 (step S130).

Since the rule for the unary coding unit 110 of the converting apparatus 100 included in the encoding apparatus 200 according to the modification of the first embodiment is as shown in FIG. 4, when the rule under which the bit values '0' and '1' are reversed from those of the unary code by the unary coding unit 110 of the converting apparatus 100 included in the encoding apparatus 200 according to the modification of the first embodiment is the rule as shown in FIG. 7 in which the bit value '0' is replaced by the bit value '1' and the bit value '1' is replaced by the bit value '0' in the bit values of each unary code in FIG. 4.

More specifically, the unary decoding unit 130 reads the unary code sequence until the bit value '1' appears, obtains the number of bit values '0' which appear up to the point as an integer value and performs the processing sequentially from the start to the end of the unary code sequence. Note that the unary decoding unit 130 exceptionally obtains the number of bit values '0' appearing between an immediately previous integer value obtained and the bit at the end only when the unit has read the unary code sequence to the bit at the end.

The unary decoding unit 130 may first add a bit value '1' to the end of the unary code sequence, and then read the unary code sequence with the bit value '1' added until the bit value '1' appears, obtain the number of bit values '0' which appear up to the point as an integer value, and sequentially perform the processing from the start to the end of the unary code sequence with the bit value '1' added.

<<Decoding Apparatus>>

As shown in FIG. 5, the decoding apparatus 300 according to the modification of the first embodiment includes an integer decoding unit 310 and a converting apparatus 100 similarly to the decoding apparatus 300 according to the first embodiment. The operation of the integer decoding unit 310 of the decoding apparatus 300 according to the modification of the first embodiment is the same as the operation of the integer decoding unit 310 of the decoding apparatus 300 according to the first embodiment. The converting apparatus 100 included in the decoding apparatus 300 according to the modification of the first embodiment does not include the bit reversing unit 120 illustrated by the dashed line in FIG. 5 and includes a unary coding unit 110 and a unary decoding unit 130. When compared with the converting apparatus 100 included in the decoding apparatus 300 according to the first embodiment, the operation of the unary coding unit 110 is the same and the unary decoding unit 130 operates differently in the converting apparatus 100 included in the decoding apparatus 300 according to the modification of the first embodiment. Hereinafter, the feature of the decoding apparatus 300 according to the modification of the first embodiment different form the decoding apparatus 300 according to the first embodiment will be described.

[Unary Decoding Unit 130]

The unary decoding unit 130 of the converting apparatus 100 included in the decoding apparatus 300 according to the modification of the first embodiment receives a decoding side unary code sequence output by the unary coding unit 110 and subjects the decoding side unary code sequence to unary decoding based on the rule under which the bit value '0' and the bit value '1' are reversed from the unary coding by the unary coding unit 110 of the converting apparatus 100 included in the decoding apparatus 300 according to the modification of the first embodiment to obtain a decoded integer sequence and outputs the obtained decoded code sequence (step S130).

The rule of the unary coding unit 110 of the converting apparatus 100 included in the decoding apparatus 300 according to the modification of the first embodiment is the rule as shown in FIG. 4 and therefore the rule under which the bit value '0' and the bit value '1' are reversed from the unary coding by the unary coding unit 110 of the converting apparatus 100 included in the decoding apparatus 300 according to the modification of the first embodiment is the rule as shown in FIG. 7 in which the bit value '0' is replaced by the bit value '1' and the bit value '1' is replaced by the bit value '0' in the bit values of the unary codes in FIG. 4.

More specifically, the unary decoding unit 130 reads the decoding side unary code sequence until the bit value '1' appears, obtains the number of bit values '0' that appear in-between as an integer value, and performs the processing sequentially from the start to the end of the decoding side unary code sequence. Note that the unary decoding unit 130 ignores the bit value '0' at the end of the decoding side unary code sequence and subjects bit values up to the bit value '1' immediately before the bit value at the end of the decoding side unary code sequence.

Alternatively, the unary decoding unit 130 may first delete the bit value '0' at the end of the decoding side unary code sequence, then read the decoding side unary code sequence removed of the bit value '0' until the bit value '1' appears, and then obtain the number of the bit values '0' that appear in-between as an integer value, and the processing may be sequentially carried out from the start to the end of the decoding side unary code sequence.

Second Embodiment

When Golomb coding is used in an integer encoding unit, a Golomb parameter may be used adaptively depending on the distribution of an input integer value sequence. Therefore, an optimum Golomb parameter for an integer sequence obtained by converting a subsequence of input integer values by the converting apparatus 100 according to the present invention may be determined on the basis of a conventional method for estimating the optimum Golomb parameter, and the integer sequence after the conversion may be encoded using the obtained Golomb parameter s, and decoding corresponding to the encoding may be performed. This embodiment will be described as a second embodiment of the invention.

<<Encoding Apparatus>>

Figure 8:
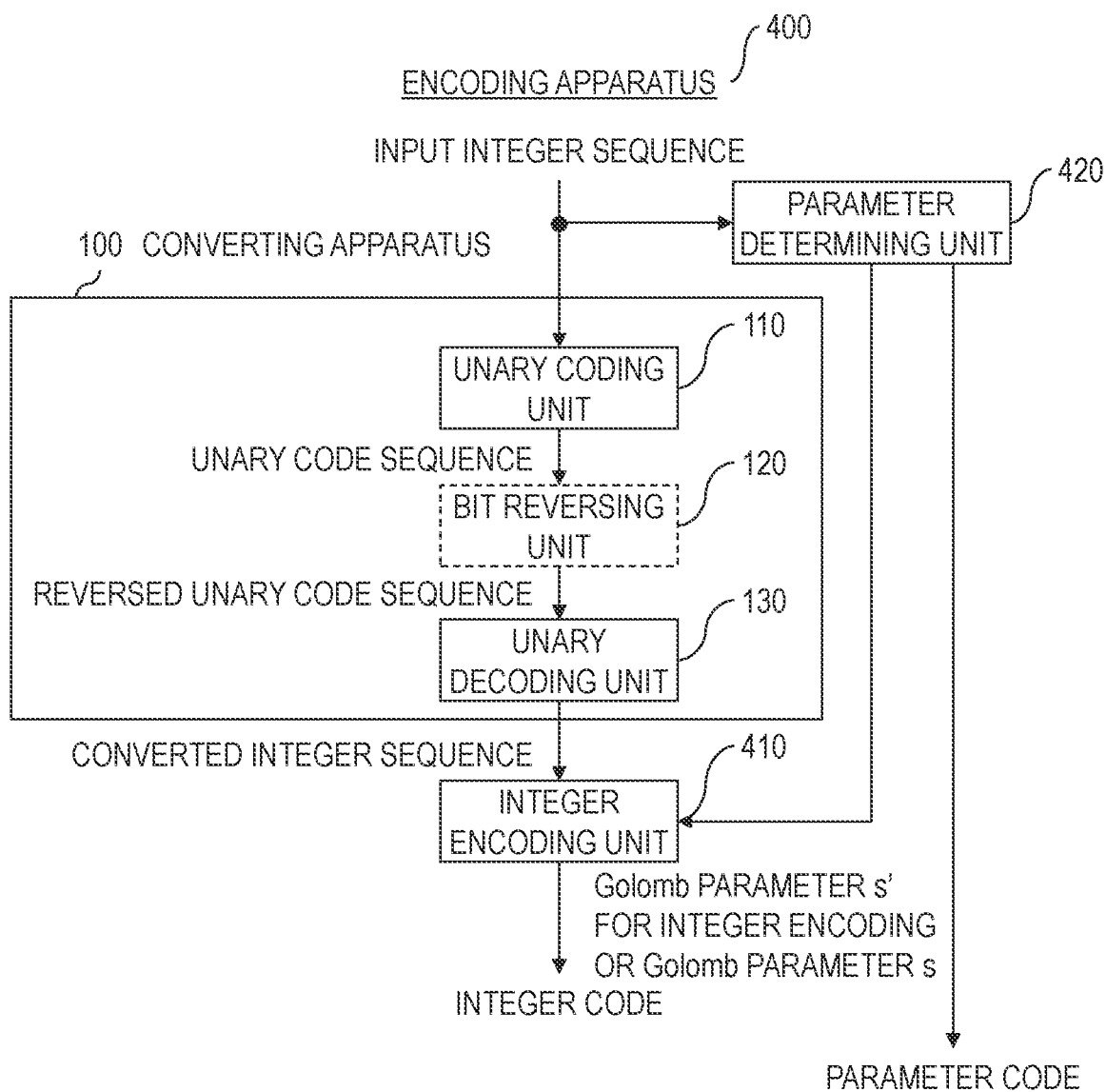
FIG. 8 is a block diagram of an exemplary configuration of an encoding apparatus 400 according to a second embodiment.
Figure 9:
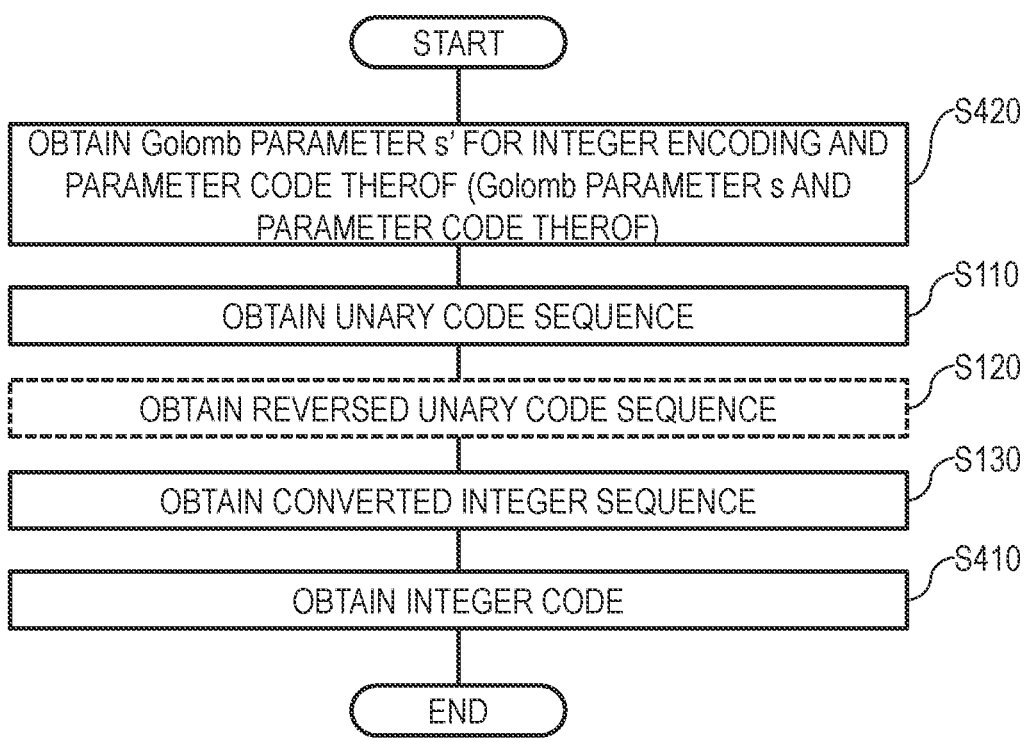
FIG. 9 is a flowchart for illustrating exemplary operation by the encoding apparatus 400 according to the second embodiment.

Referring to FIGS. 8 and 9, the procedure of processing in an encoding method performed by an encoding apparatus 400 according to the second embodiment including the converting apparatus 100 according to the present invention will be described. As shown in FIG. 8, the encoding apparatus 400 according to the second embodiment includes a parameter determining unit 420, a converting apparatus 100, and an integer encoding unit 410. The encoding method according to the second embodiment including the converting method according to the present invention is implemented as the encoding apparatus 400 according to the second embodiment performs the processing in steps shown in FIG. 9.

Similarly to the first embodiment, a sequence of non-negative integer values is input to the encoding apparatus 400 according to the second embodiment. The sequence of non-negative integer values input to the encoding apparatus 400 according to the second embodiment is input to the parameter determining unit 420 and the converting apparatus 100 N samples at a time. More specifically, the encoding apparatus 400 according to the second embodiment converts speech or music collected by a microphone into a digital signal, quantizes the result, and encodes the obtained sequence of integer values such as a sequence of the absolute values of integer values on an N-sample frame basis.

In the following description, a non-negative integer value input to the encoding apparatus 400 according to the embodiment will be simply referred to as an "integer value".

[Parameter Determining Unit 420]

An integer sequence for each N samples (hereinafter referred to as an "input integer sequence") from the integer value sequence input to the encoding apparatus 400 is input to the parameter determining unit 420. The parameter determining unit 420 obtains and outputs a Golomb parameter s' for integer encoding and a parameter code representing the parameter on the basis of the input integer sequence (step S420). The parameter code may be obtained by encoding a Golomb parameter as a decoding apparatus 500 decodes the parameter code so as to obtain the Golomb parameter s' for integer decoding which is the same value as the Golomb parameter s' for integer encoding determined by the parameter determining unit 420.

For example, the parameter determining unit 420 obtains the Golomb parameter s by Expression (3) using the integer values included in the input integer sequence.

[Math. 3]

$$s = \frac{\ln 2}{N} \sum_{n=1}^{N} x_n \quad (3)$$

The Golomb parameter s obtained by Expression (3) minimizes an estimated value for the total bit length in Golomb coding without conversion estimated by Expression (2) for the input integer sequence.

The parameter determining unit 420, for example, scalar-quantizes the inverse of the Golomb parameter s obtained by Expression (3) to obtain a code, outputs the obtained code as a parameter code, and outputs a quantized value of the inverse of the Golomb parameter s corresponding to the parameter code as a Golomb parameter s' for integer encoding.

[Converting Apparatus 100]

The converting apparatus 100 has the same configuration as the converting apparatus 100 included in the encoding apparatus 200 according to the first embodiment, and includes a unary coding unit 110, a bit reversing unit 120, and a unary decoding unit 130, or the same configuration as the converting apparatus 100 included in the encoding apparatus 200 according to the modification of the first embodiment, and includes a unary coding unit 110 and a unary decoding unit 130. The converting apparatus 100 receives an input integer sequence for each N samples from a sequence of integer values input to the encoding apparatus 400. The converting apparatus 100 subjects the input integer sequence to the same processing as the converting apparatus 100 included in the encoding apparatus 200 according to the first embodiment or the converting apparatus 100 included in the encoding apparatus 200 according to the modification of the first embodiment, and outputs the obtained converted integer sequence to the integer encoding unit 410.

[Integer Encoding Unit 410] A Golomb parameter s' for integer encoding output by the parameter determining unit 420 and the converted integer sequence output by the converting apparatus 100 are input to the integer encoding unit 410. The integer encoding unit 410 rounds the Golomb parameter s' for integer encoding to an integer value ˆs' by rounding off the first decimal place of the Golomb parameter s' for integer encoding to the nearest integer, and then subjects the input converted integer sequence to Golomb coding with the Golomb parameter ˆs' to output a code obtained by the Golomb coding as an integer code (step S410). Note that the Golomb parameter s' for integer encoding which is less than 1 is round off to an integer value ˆs'=1.

<<Decoding Apparatus>>

Figure 10:
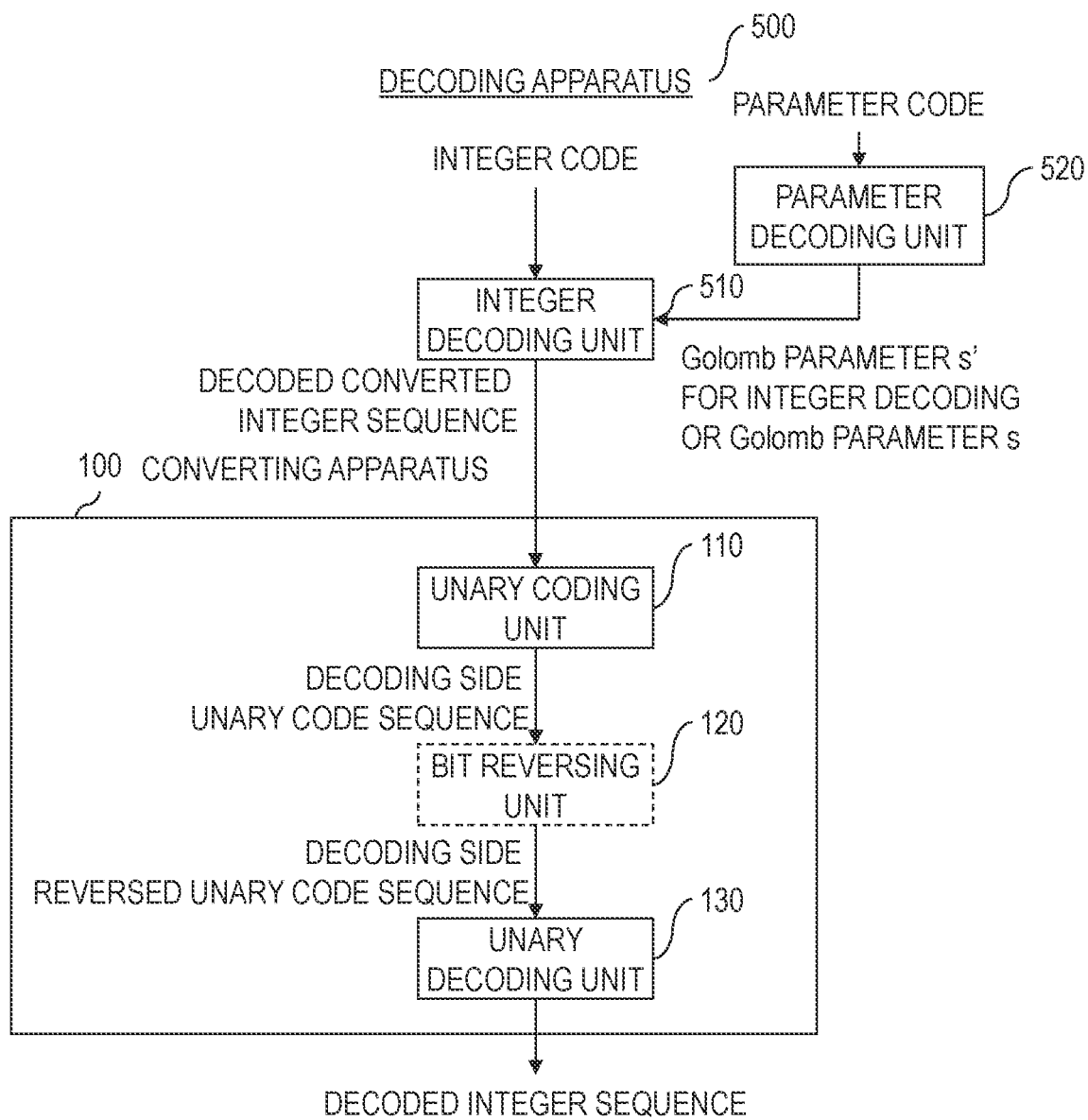
FIG. 10 is a block diagram of an exemplary configuration of a decoding apparatus 500 according to the second embodiment.
Figure 11:
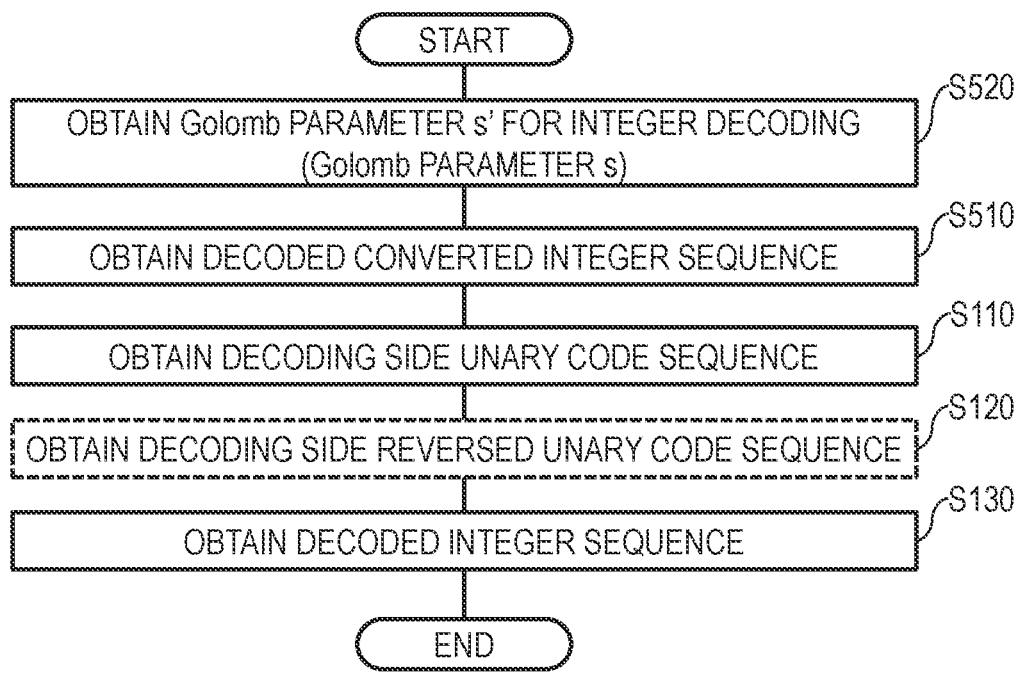
FIG. 11 is a flowchart for illustrating exemplary operation by the decoding apparatus 500 according to the second embodiment.

Referring to FIGS. 10 and 11, the procedure of processing in a decoding method performed by the decoding apparatus 500 according to the second embodiment including the converting apparatus 100 according to the present invention will be described. As shown in FIG. 10, the decoding apparatus 500 according to the second embodiment includes a parameter decoding unit 520, an integer decoding unit 510, and a converting apparatus 100. As the decoding apparatus 500 according to the second embodiment performs the processing in steps shown in FIG. 11, the decoding method according to the second embodiment including the converting method according to the present invention is implemented.

An integer code and a parameter code output by the encoding apparatus 400 according to the second embodiment are input to the decoding apparatus 500 according to the second embodiment. The integer code and the parameter code input to the decoding apparatus 500 are input, the parameter code is input to the parameter decoding unit 520 for codes corresponding to N samples from an integer value sequence, and the integer code is input to the integer decoding unit 510 for the codes corresponding to N samples. More specifically, the decoding apparatus 500 performs decoding processing each for the same frame as the encoding apparatus 400.

[Parameter Decoding Unit 520]

The parameter code input to the decoding apparatus 500 is input to the parameter decoding unit 520. The parameter decoding unit 520 decodes the parameter code by decoding processing corresponding to the processing by which the parameter determining unit 420 of the encoding apparatus 400 according to the second embodiment has obtained the parameter code, and obtains a Golomb parameter s' for integer decoding (step S520). For example, the parameter decoding unit 520 obtains a Golomb parameter s' for integer decoding corresponding to the parameter code by decoding processing corresponding to scalar-quantization performed by the parameter determining unit 420 of the encoding apparatus 400 according to the second embodiment and outputs the parameter to the integer decoding unit 510.

[Integer Decoding Unit 510]

The integer decoding unit 510 receives the integer code input to the decoding apparatus 500 and the Golomb parameter s' for integer decoding output by the parameter decoding unit 520. The integer decoding unit 510 rounds the Golomb parameters s' for integer decoding to the integer value $\hat{s}'$ by the same method as that performed by the integer encoding unit 410 of the encoding apparatus 400 according to the second embodiment, then subjects the integer code to Golomb decoding with the Golomb parameter $\hat{s}'$ of the integer value to obtain a decoded converted integer sequence, and outputs the decoded converted integer sequence to the converting apparatus 100 (step S510).

[Converting Apparatus 100]

The converting apparatus 100 has the same configuration as that of the converting apparatus 100 included in the decoding apparatus 300 according to the first embodiment and includes a unary coding unit 110, a bit reversing unit 120, and a unary decoding unit 130 or the same configuration as that of the converting apparatus 100 included in the decoding apparatus 300 according to the modification of the first embodiment and includes a unary coding unit 110 and a unary decoding unit 130. The decoded converted integer sequence output by the integer decoding unit 510 is input to the converting apparatus 100. The converting apparatus 100 subjects the input decoded converted integer sequence to the same processing as the processing performed by the converting apparatus 100 included in the decoding apparatus 300 according to the first embodiment or the converting apparatus 100 included in the decoding apparatus 300 according to the modification of the first embodiment to obtain a decoded integer sequence and outputs the obtained decoded integer sequence.

Modification of Second Embodiment

According to the second embodiment, the parameter code representing the Golomb parameter s' for integer encoding corresponding to the inverse of the Golomb parameter s is obtained, but a parameter code representing the Golomb parameter s may be obtained. This embodiment will be described as a modification of the second embodiment.

<<Encoding Apparatus>>

As shown in FIG. 8, the encoding apparatus 400 according to the modification of the second embodiment includes a parameter determining unit 420, a converting apparatus 100, and an integer encoding unit 410 similarly to the encoding apparatus 400 according to the second embodiment. The encoding apparatus 400 according to the modification of the second embodiment is different from the encoding apparatus 400 according to the second embodiment in that the parameter determining unit 420 and the integer encoding unit 410 operate differently. Hereinafter, the encoding apparatus 400 according to the modification of the second embodiment will be described with reference to the difference from the encoding apparatus 400 according to the second embodiment.

[Parameter Determining Unit 420]

An integer sequence (hereinafter referred to as an "input integer sequence") for each N samples from a sequence of integer values input to the encoding apparatus 400 is input to the parameter determining unit 420. The parameter determining unit 420 obtains and outputs a Golomb parameter s corresponding to the integer sequence and a parameter code representing the Golomb parameter s on the basis of the input integer sequence (step S420). The parameter code may be obtained by encoding the Golomb parameter s so that the Golomb parameter s determined by the parameter determining unit 420 can be obtained when the decoding apparatus 500 decodes the parameter code.

For example, the parameter determining unit 420 obtains the Golomb parameter s by Expression (3) by using integer values included in an input integer sequence, subjects the obtained Golomb parameter s to scalar-quantization to obtain a code, and outputs the obtained code as a parameter code and the quantized value of the Golomb parameter s corresponding to the parameter code as the Golomb parameter s.

[Integer Encoding Unit 410]

The Golomb parameter s output by the parameter determining unit 420 and the converted integer sequence output by the converting apparatus 100 are input to the integer encoding unit 410. The integer encoding unit 410 rounds the inverse of the Golomb parameter s to an integer value $\hat{s}'$ by rounding off the first decimal place, and then subjects the input converted integer sequence to Golomb coding using the integer value $\hat{s}'$ as a Golomb parameter to output a code obtained by the Golomb coding as an integer code (step S410). Note that when the inverse of the Golomb parameter s is less than 1, the inverse of the Golomb parameter s is rounded to the integer value $\hat{s}'=1$.

<<Decoding Apparatus>>

As shown in FIG. 10, the decoding apparatus 500 according to the modification of the second embodiment includes a parameter decoding unit 520, an integer decoding unit 510, and a converting apparatus 100 similarly to the decoding apparatus 500 according to the second embodiment. The decoding apparatus 500 according to the modification of the second embodiment is different from the decoding apparatus 500 according to the second embodiment in that the parameter decoding unit 520 and the integer decoding unit 510 operate differently. Hereinafter, the decoding apparatus 500 according to the modification of the second embodiment will be described in comparison to the decoding apparatus 500 according to the second embodiment.

[Parameter Decoding Unit 520]

The parameter decoding unit 520 receives a parameter code input to the decoding apparatus 500 according to the modification of the second embodiment. The parameter decoding unit 520 obtains a Golomb parameter s by decoding the parameter code by decoding processing corresponding to the processing by which the parameter determining unit 420 of the encoding apparatus 400 according to the modification of the second embodiment obtains the parameter code and outputs the obtained Golomb parameter s (step S520). For example, the parameter decoding unit 520 may obtain a quantized value of the Golomb parameters s corresponding to the parameter code as the Golomb parameter s by decoding processing corresponding to the scalar-quantization performed by the parameter determining unit 420 of the encoding apparatus 400 according to the modification of the second embodiment.

[Integer Decoding Unit 510]

The integer decoding unit 510 receives the integer code input to the decoding apparatus 500 and the Golomb parameter s output by the parameter decoding unit 520. The integer decoding unit 510 rounds the inverse of the Golomb parameter s to the integer value ˆs' by the same method as that performed by the integer encoding unit 410 of the encoding apparatus 400 according to the modification of the second embodiment, then subjects the integer code to Golomb decoding using the integer value ˆs' as the Golomb parameter ˆs' to obtain the decoded code and output the code to the converting apparatus 100 (step S510).

Third Embodiment

As in the foregoing, efficient encoding by integer encoding after conversion by the converting apparatus 100 according to the present invention can be performed only when a sequence of integer values according to a distribution for which a Golomb parameter greater than 0 and less than 1 should be used is input and subjected to Golomb coding by an integer encoding unit. Therefore, an optimum Golomb parameter s may be determined for a subsequence of an input integer value sequence on the basis of a conventional method for estimating an optimum Golomb parameter, whether to use the converting apparatus 100 according to the present invention may be determined on the basis of the obtained Golomb parameter s, so that the processing for converting the input integer value sequence and encoding the result and the processing for directly encoding the input integer value sequence without converting the sequence may be performed in an adaptive manner for each of subsequences, and decoding corresponding to the encoding may be performed. This embodiment will be described as a third embodiment.

<<Encoding Apparatus>>

Figure 12:
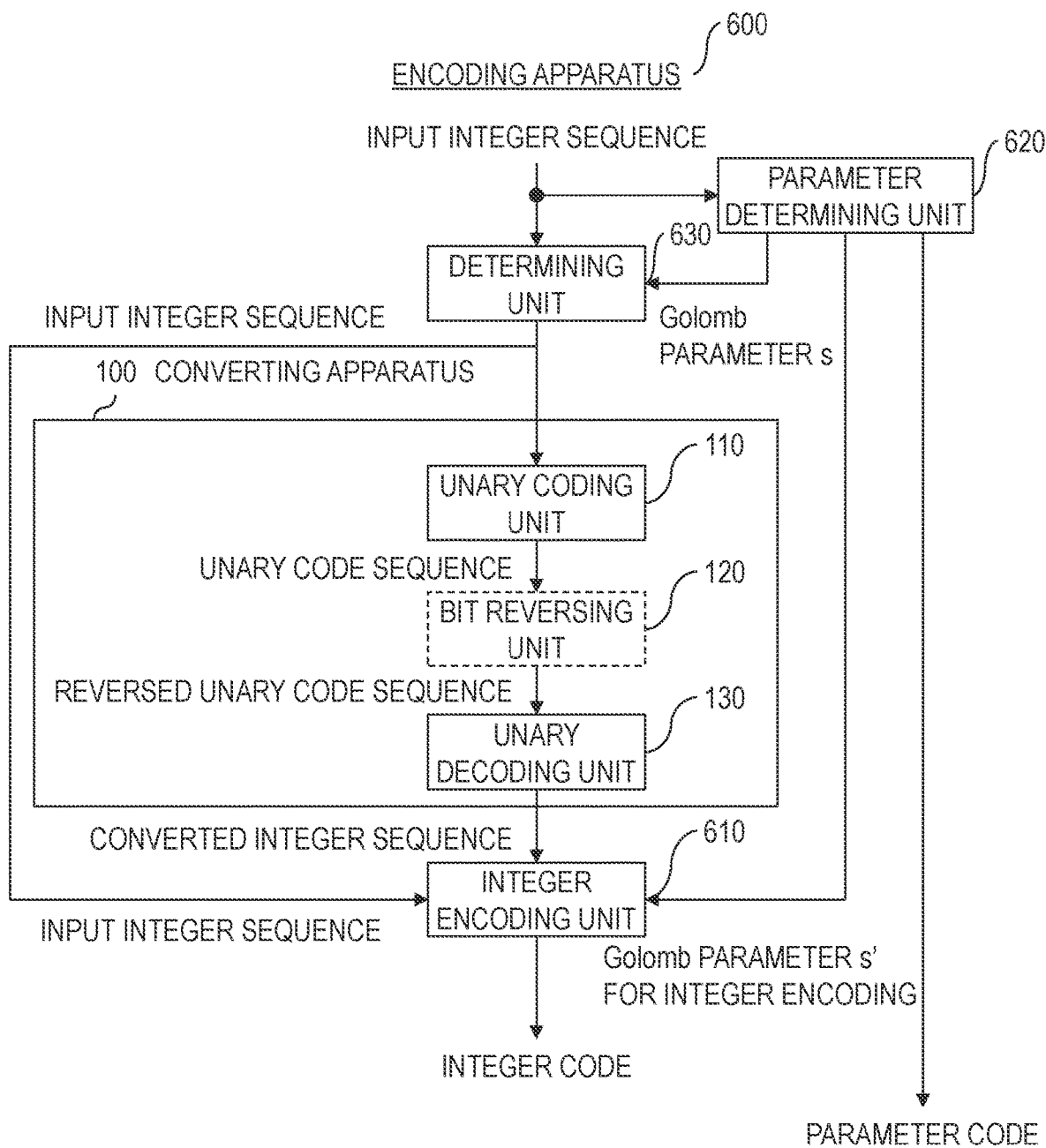
FIG. 12 is a block diagram of an exemplary configuration of an encoding apparatus 600 according to a third embodiment.
Figure 13:
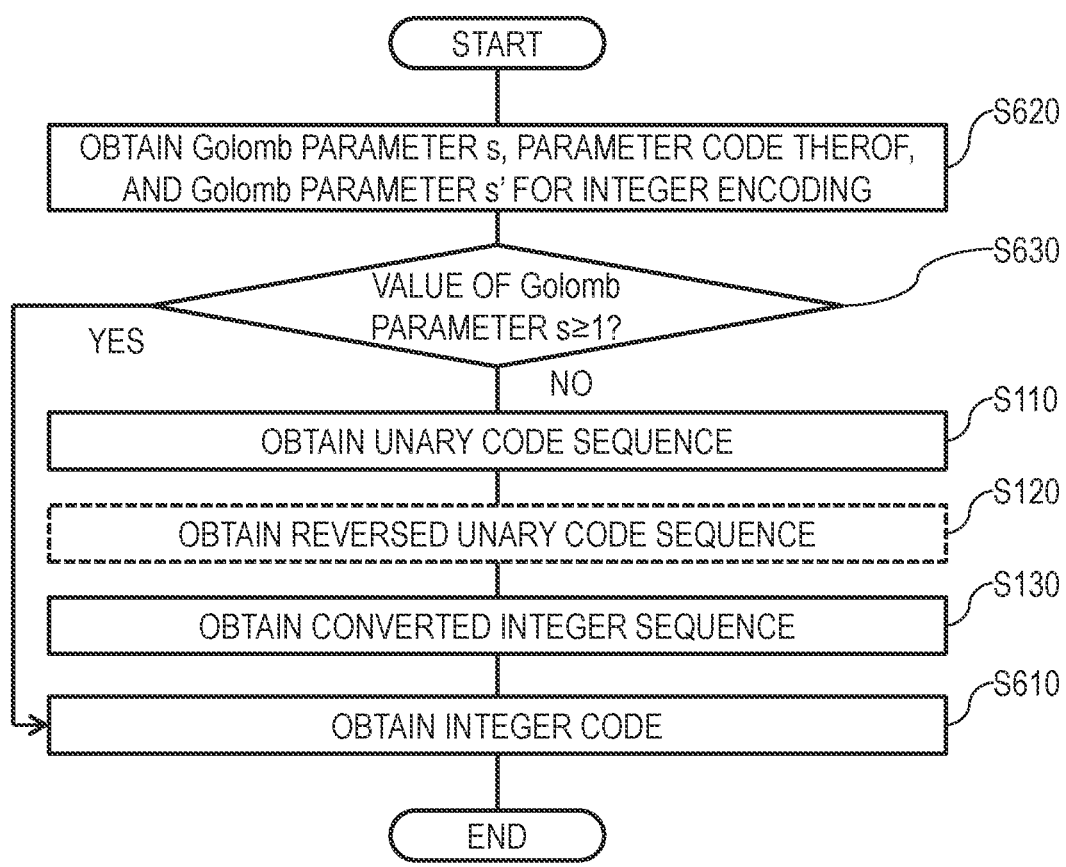
FIG. 13 is a flowchart for illustrating exemplary operation by the encoding apparatus 600 according to the third embodiment.

Referring to FIGS. 12 and 13, the procedure of processing in an encoding method performed by an encoding apparatus 600 according to the third embodiment including the converting apparatus 100 according to the present invention will be described. As shown in FIG. 12, the encoding apparatus 600 according to the third embodiment includes a parameter determining unit 620, a determining unit 630, a converting apparatus 100, and an integer encoding unit 610. The encoding method according to the third embodiment including the converting method according to the present invention is implemented as processing in steps shown in FIG. 13 by the encoding apparatus 600 according to the third embodiment is performed.

Similarly to the first embodiment, a sequence of non-negative integer values is input to the encoding apparatus 600 according to the third embodiment. The sequence of non-negative integers input to the encoding apparatus 600 according to the third embodiment is input to the parameter determining unit 620 and the determining unit 630 N samples at a time. More specifically, the encoding apparatus 600 according to the third embodiment encodes, on a N-sample frame basis, an integer value sequence such as a sequence of the absolute values of integer values obtained by converting speech or music collected for example by a microphone into a digital signal followed by quantization.

In the following, a non-negative integer value input to the encoding apparatus 600 according to the embodiment will be simply referred to as an "integer value."

[Parameter Determining Unit 620]

An integer sequence (hereinafter referred to as an "input integer sequence") for each N samples from the sequence of integer values input to the encoding apparatus 600 is input to the parameter determining unit 620. The parameter determining unit 620 obtains and outputs a Golomb parameter s corresponding to the integer sequence, a parameter code as a code representing the Golomb parameter s, and a Golomb parameter s' for integer encoding on the basis of the input integer sequence (step S620). The parameter code may be obtained by encoding the Golomb parameter s so that the Golomb parameter s determined by the parameter determining unit 620 is obtained as the decoding apparatus 700 decodes the parameter code.

For example, the parameter determining unit 620 obtains the Golomb parameter s using integer values included in the input integer sequence by Expression (3), subjects the obtained Golomb parameter s to scalar-quantization to obtain the code and outputs the obtained code as a parameter code, and outputs a quantized value of the Golomb parameter s corresponding to the parameter code as the Golomb parameter s.

When the value of the Golomb parameter s is at least 1, the parameter determining unit 620 directly outputs the Golomb parameter s to the integer encoding unit 610 as the Golomb parameter s' for integer encoding and when the value of the Golomb parameter s is less than 1, the parameter determining unit 620 outputs the inverse of the Golomb parameter s as the Golomb parameter s' for integer encoding to the integer encoding unit 610.

[Determining Unit 630]

An input integer sequence for each N samples from the integer value sequence input to the encoding apparatus 600 and the Golomb parameter s output by the parameter determining unit 620 are input to the determining unit 630. The determining unit 630 outputs the input integer sequence to the integer encoding unit 610 when the value of the input Golomb parameter s is at least 1, and outputs the input integer sequence to the converting apparatus 100 when the value of the input Golomb parameter s is less than 1 (step S630).

[Converting Apparatus 100]

The converting apparatus 100 has the same configuration as that of the converting apparatus 100 included in the encoding apparatus 200 according to the first embodiment, and includes a unary coding unit 110, a bit reversing unit 120, and a unary decoding unit 130, or the same configuration as the converting apparatus 100 included in the encoding apparatus 200 according to the modification of the first embodiment and includes a unary coding unit 110 and a unary decoding unit 130. The input integer sequence output by the determining unit 630 is input to the converting apparatus 100. When an input integer sequence is input from the determining unit 630, the converting apparatus 100 subjects the input integer sequence to the same processing as the processing performed by the converting apparatus 100 included in the encoding apparatus 200 according to the first embodiment or the converting apparatus 100 included in the encoding apparatus 200 according to the modification of the first embodiment to obtain a converted integer sequence and outputs the obtained converted integer sequence to the integer encoding unit 610. When there is no input from the determining unit 630, the converting apparatus 100 performs no operation and outputs nothing.

[Integer Encoding Unit 610]

The Golomb parameter s' for integer encoding output by the parameter determining unit 620, and one of the input integer sequence output by the determining unit 630 and the converted integer sequence output by the converting apparatus 100 are input to the integer encoding unit 610. The integer encoding unit 610 rounds the Golomb parameter s' for integer encoding to an integer value ˆs' by rounding off the first decimal place of the Golomb parameter s' for integer encoding, and then subjects one of the input integer sequence output by the determining unit 630 and the converted integer sequence output by the converting apparatus 100 to Golomb coding with the Golomb parameter ˆs' of the integer value to obtain a code, and outputs the code obtained by the Golomb coding as an integer code (step S610).

As the encoding apparatus 600 according to the third embodiment perform the above operation, the converting apparatus 100 obtains the converted integer sequence from the input integer sequence and the integer encoding unit 610 subjects the converted integer sequence to Golomb coding using the inverse of the Golomb parameter s as the Golomb parameter and obtains an integer code when the Golomb parameter s obtained by the parameter determining unit 620 is less than 1, and the integer encoding unit 610 subjects the input integer sequence to Golomb coding using the Golomb parameter s obtained by the parameter determining unit 620 as the Golomb parameter and obtains an integer code when the Golomb parameter s obtained by the parameter determining unit 620 is at least 1.

<<Decoding Apparatus>>

Figure 14:
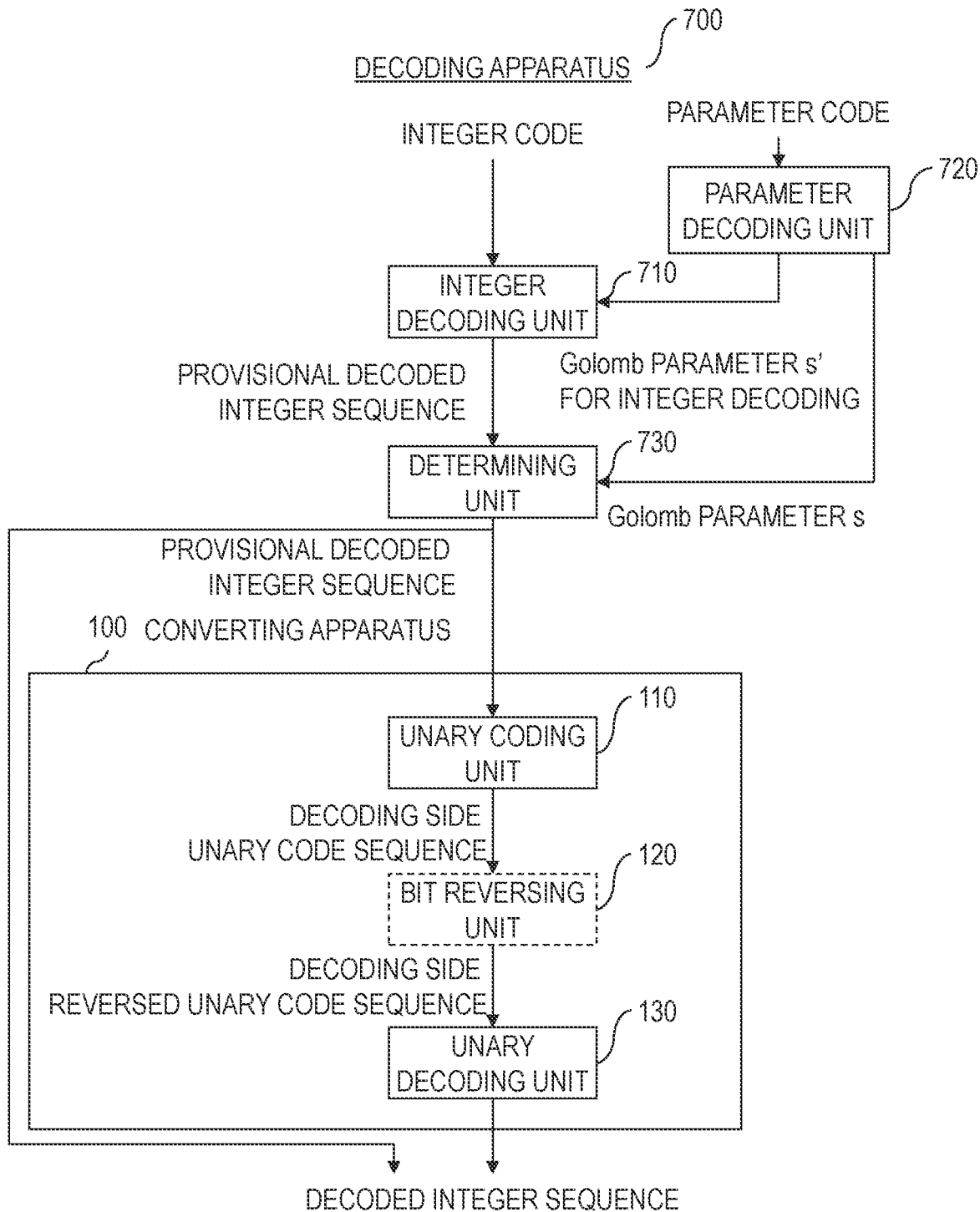
FIG. 14 is a block diagram of an exemplary configuration of a decoding apparatus 700 according to the third embodiment.
Figure 15:
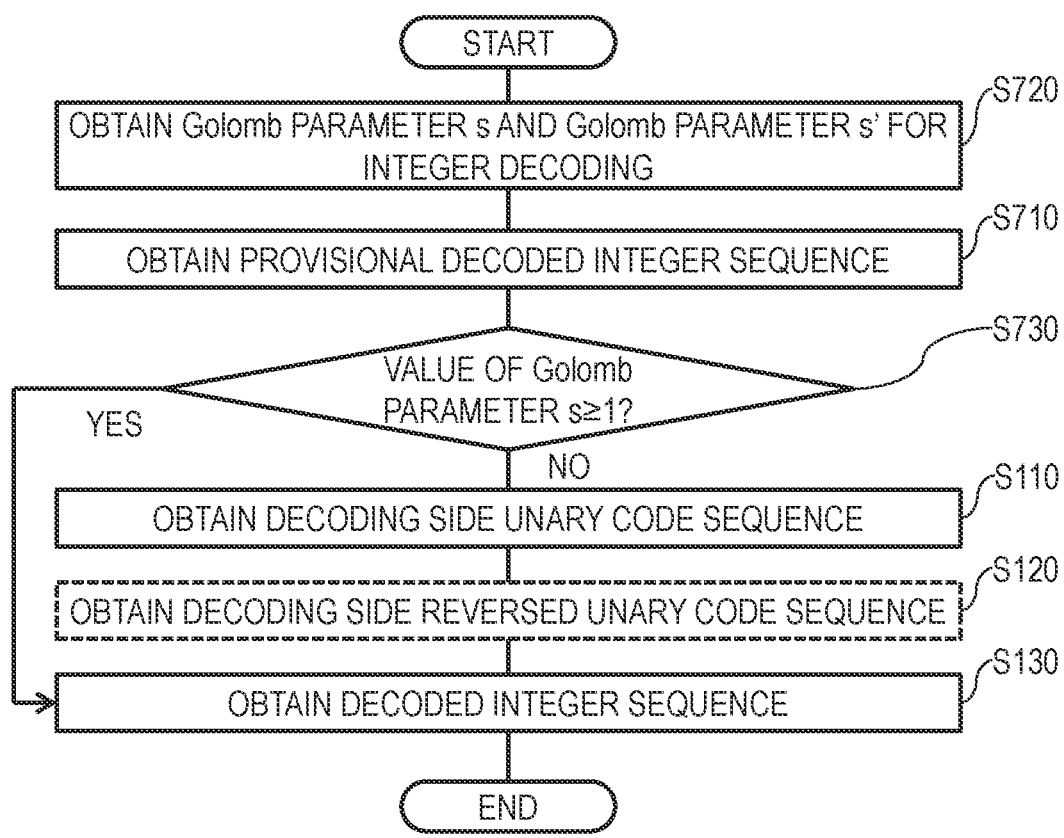
FIG. 15 is a flowchart for illustrating exemplary operation by the decoding apparatus 700 according to the third embodiment.

Referring to FIGS. 14 and 15, the procedure of processing in a decoding method performed by the decoding apparatus 700 according to the third embodiment including the converting apparatus 100 according to the present invention will be described. As shown in FIG. 14, the decoding apparatus 700 according to the third embodiment includes a parameter decoding unit 720, a determining unit 730, an integer decoding unit 710, and a converting apparatus 100. As the decoding apparatus 700 according to the third embodiment performs the processing in steps shown in FIG. 15, the decoding method according to the third embodiment including the converting method according to the present invention is implemented.

An integer code and a parameter code output by the encoding apparatus 600 according to the third embodiment are input to the decoding apparatus 700 according to the third embodiment. The integer code and the parameter code input to the decoding apparatus 700 are input, the parameter code is input to the parameter decoding unit 720 each for codes corresponding to N samples from the integer value sequence, and the integer code is input to the integer decoding unit 710 for the codes corresponding to N samples. More specifically, the decoding apparatus 700 performs decoding processing on the basis of the same frame as the encoding apparatus 600.

[Parameter Decoding Unit 720]

A parameter code input to the decoding apparatus 700 is input to the parameter decoding unit 720. The parameter decoding unit 720 decodes the parameter code by the decoding processing corresponding to the processing by which the parameter code is obtained by the parameter determining unit 620 of the encoding apparatus 600 according to the third embodiment, obtains the Golomb parameter s, and outputs the obtained Golomb parameter s to the determining unit 730. The parameter decoding unit 720, for example, obtains the quantized value of the Golomb parameter s corresponding to the parameter code as the Golomb parameter s by the decoding process corresponding to the scalar-quantization performed by the parameter determining unit 620 of the encoding apparatus 600 according to the third embodiment.

When the value of the Golomb parameter s is at least 1, the parameter decoding unit 720 outputs the Golomb parameter s directly to the integer decoding unit 710 as the Golomb parameter s' for integer decoding and when the value of the Golomb parameter s is less than 1, the parameter decoding unit 720 outputs the inverse of the Golomb parameter s as the Golomb parameter s' for integer decoding to the integer decoding unit 710 (step S720).

[Integer Decoding Unit 710]

The integer decoding unit 710 receives the integer code input to the decoding apparatus 700 and the Golomb parameter s' for integer decoding output by the parameter decoding unit 720. The integer decoding unit 710 rounds the Golomb parameters s' for integer decoding to an integer value ˆs' by the same method as that performed by the integer encoding unit 610 of the encoding apparatus 600 according to the third embodiment and then, the integer decoding unit 710 performs Golomb decoding using the integer value ˆs' as a Golomb parameter for an integer code to obtain an integer sequence (hereinafter referred to as a provisional decoded integer sequence) and outputs the sequence to the determining unit 730 (step S710).

[Determining Unit 730]

The Golomb parameter s output by the parameter decoding unit 720 and the provisional decoded integer sequence output by the integer decoding unit 710 are input to the determining unit 730. When the value of the Golomb parameter s is at least 1, the determining unit 730 directly outputs the input provisional decoded integer sequence as a decoded integer sequence, and outputs the input provisional decoded integer sequence to the converting apparatus 100 when the value of the Golomb parameter s is less than 1 (step S730).

[Converting Apparatus 100]

The converting apparatus 100 has the same configuration as the converting apparatus 100 included in the decoding apparatus 300 according to the first embodiment and includes a unary coding unit 110, a bit reversing unit 120, and a unary decoding unit 130, or the same configuration as the converting apparatus 100 included in the decoding apparatus 300 according to the modification of the first embodiment, and includes a unary coding unit 110 and a unary decoding unit 130. The provisional decoded integer sequence output by the determining unit 730 is input to the converting apparatus 100. When the provisional decoded integer sequence is input from the determining unit 730, the converting apparatus 100 performs the same processing as the converting apparatus 100 included in the decoding apparatus 300 of the first embodiment or the converting apparatus 100 included in the decoding apparatus 300 according to the modification of the first embodiment to the input provisional decoded integer sequence, obtains a decoded integer sequence, and outputs the resulting decoded integer sequence. When the provisional decoded integer sequence is not input from the determining unit 730, the converting apparatus 100 does not operate and outputs nothing.

As the decoding apparatus 700 according to the third embodiment carries out the above-described operation, when the Golomb parameter s obtained by the parameter decoding unit 720 is less than 1, the integer decoding unit 710 subjects the input integer code to Golomb decoding using the inverse of the Golomb parameter s obtained by the parameter decoding unit 720 as a Golomb parameter to obtain a provisional decoded integer value sequence as a sequence of non-negative integers and the converting apparatus 100 obtains and outputs a decoded integer sequence as a sequence of non-negative integer values from the provisional decoded integer value sequence and, when the Golomb parameter s obtained by the parameter decoding unit 720 is at least 1, the integer decoding unit 710 subjects the input integer code to Golomb decoding by using the Golomb parameter s obtained by the parameter decoding unit 720 as a Golomb parameter to obtain a non-negative integer value sequence and output the sequence as a decoded integer sequence.

<Appendix>

The device according to the present invention includes, for example, as a single hardware entity, an input unit connectable for example with a keyboard, an output unit connectable for example with a liquid crystal display, a communication unit connectable with a communication device (such as a communication cable) allowed to communicate with the outside of the hardware entity, a CPU (Central Processing Unit which may include a cache memory and a register), a RAM or a ROM as a memory, an external storage device that is a hard disk, and a bus connected to allow data to be exchanged among the input unit, the output unit, the communication unit, the CPU, the RAM, the ROM, and the external storage device. If required, device (drive) may be provided at the hardware entity that can read and write from/to a recording medium such as a CD-ROM. An example of physical entities including such hardware resources includes a general-purpose computer.

The external storage device of the hardware entity stores programs required to implement the above-described functions and data required for processing the programs. (The programs may be stored in a ROM or a read only memory as well as in the external storage device.) The data obtained by processing the program is stored as appropriate in the RAM or the external storage device.

In the hardware entity, each of the programs stored in the external storage device (or a ROM) and the data required for the processing of each of the programs are read into a memory as required, and interpreted, executed, and processed in the CPU as appropriate. As a result, the CPU achieves a predetermined function (any of the elements referred to as units or means in the above description).

The present invention is not limited by the embodiments described above and may be modified as appropriate without departing from the gist of invention.

For example in the above-described embodiment, a sequence of non-negative integer values input to the encoding apparatus is described as a sequence based on the absolute values of integer values obtained by quantizing a signal obtained by converting sound, image, or video signals into digital signals to a finite precision value. However, a sequence of non-negative integer values input to the encoding apparatus may be a sequence based on the absolute value of an integer value obtained by quantizing a time-series signal based on a biological signal other than the above such as an electrocardiogram, a magneto-cardiogram, an electroencephalogram, a surface electromyography, and an electrodermogram to obtain a finite precision value.

Alternatively, a sequence of non-negative integers input to the encoding apparatus may be a sequence of the absolute values of integer values obtained by quantizing, to finite precision values, signals other than time-series signals for example based on medical images obtained from computed tomography, nuclear magnetic resonance imaging, ultrasonographic imaging, and angiography. The sequence of non-negative integer values input to the encoding apparatus may be a sequence of the absolute values of integer values obtained by quantizing, to finite precision values, a sequence of non-signal values such as a quality score representing a measurement error for each gene in a genetic information sequence.

The sequence of non-negative integer values input to the encoding apparatus may be a sequence of the absolute values of integer values obtained by converting a sound, image or video signal into a digital signal, subjecting the resulting signal to cosine transform to obtain a frequency spectrum, and quantizing the spectrum to finite precision values or a sequence of the absolute values of integer values obtained by filtering a sequence of numerical values other than the above signals or non-signal values through a high-pass filter or a low-pass filter, and quantizing the sequence to finite-precision values.

The encoding apparatus according to the present invention may include a converting unit (not shown) preceding the encoding apparatus in FIGS. 2, 8, and 12 as a processing unit for converting a sequence of signals or values input to the encoding apparatus into a sequence of non-negative integers in order to correspond to these inputs. Similarly, in order to obtain an output corresponding to the input described above, the decoding apparatus according to the present invention may include an inverse converting unit which is not shown in a succeeding stage to the decoding apparatus in FIGS. 5, 10, and 14 as a processing unit for converting a sequence of non-negative integer values obtained by the decoding apparatus in FIGS. 5 and 10 or 14 into a sequence of signals or numerical values.

The processing in the above description of the embodiments is performed in time series and may also be performed in parallel or individually as required or depending on the processing capacity of the device performing the processing.

As described above, when a computer implements the processing functions in hardware entities (devices according to the present invention) in the above description of the embodiments, the processing contents of the functions which should be carried out by the hardware entities are described by a program. As the program runs on a computer, the processing functions in the hardware entities are implemented on the computer.

The program describing the processing contents can be recorded on a computer-readable recording medium. Examples of the computer-readable recording medium may include a magnetic recording device, an optical disk, an optical magnetic recording medium, a semiconductor memory, and any other component. Specifically, the magnetic recording device may be a hard disk device, a flexible disk, and a magnetic tape, the optical disk may be a DVD (Digital Versatile Disc), a DVD-RAM (Random Access Memory), a CD-ROM (Compact Disc Read Only Memory), or a CD-R (Recordable)/RW (ReWritable), the optical magnetic recording medium may be an MO (Magneto-Optical Disc), and the semiconductor memory may be an EEP-ROM (Electronically Erasable and Programmable-Read Only Memory).

The program may be distributed by selling, transferring, or renting a portable recording medium such as a DVD and a CD-ROM having the program recorded thereon. The program may be stored in a storage device in a server computer and may be distributed by transferring the program from the server computer to another computer through a network.

A computer executing such a program first stores a program recorded on a portable recording medium or a program transferred from a server computer in its own storage device. When executing the processing, the computer reads the program stored in its own storage device and executes the processing according to the read program. Alternatively, the computer may read the program directly from a portable recording medium and perform the processing according to the program, and may execute the processing according to the received program sequentially every time the program is transferred from the server computer to the computer. The program may be executed by a so-called ASP (Application Service Provider) service which implements processing functions only in response to execution instructions and result retrieval without transferring the program from the server computer to the computer. Note the program in this form includes information for processing by a computer which is equivalent to a program (such as data which is not a direct instruction to the computer but has the property of defining the processing by the computer).

In this form, a hardware entity is configured as a prescribed program is caused to run on a computer, at least a part of the processing contents may be implemented hardware-wise.

The foregoing descriptions of the embodiments of the present invention have been presented for purposes of illustration and description. It is not intended to be exhaustive or to limit the invention to the precise forms disclosed. Modifications or variations are possible in light of the above teaching. The embodiments have been chosen and presented in order to provide the best illustration of the principles of the present invention and make the present invention available in various embodiments and with various modifications to suit contemplated practical use by a person skilled in the art. Such modifications and variations fall within the scope of claims defined by the appended claims interpreted according to the breadth that is fairly, impartially, and legally imparted.

The invention claimed is:

1. A converting apparatus comprising processing circuitry configured to:
   retrieve an input signal from a memory, wherein the input signal includes an input sequence of non-negative integer values;
   execute a unary coding processing that subjects the input sequence of non-negative integer values to unary coding to obtain a unary code sequence, the input sequence of non-negative integer values being hereinafter referred to as a first integer sequence;
   execute a bit reversing processing that replaces, based on a bit-by-bit operation, a bit value '0' with a bit value '1' and a bit value '1' with a bit value '0' in the bits in the unary code sequence to obtain a replaced code sequence;
   execute a unary decoding processing that subjects the replaced code sequence to unary decoding to obtain a sequence of non-negative integer values, the sequence of non-negative integer values being hereinafter referred to as a second integer sequence; and
   transmit the second integer sequence to an application for processing.

2. A converting apparatus comprising processing circuitry configured to:
   retrieve an input signal from a memory, wherein the input signal includes an input sequence of non-negative integer values;
   execute a unary coding processing that subjects the input sequence of non-negative integer values to unary coding to obtain a unary code sequence, the input sequence of non-negative integer values being referred to as a first integer sequence;
   execute a unary decoding processing that subjects the unary code sequence to unary decoding according to a rule under which, based on a bit-by-bit operation, a bit value '0' and a bit value '1' are reversed from the unary coding by the unary coding processing, to obtain a sequence of non-negative integer values, the sequence of non-negative integer values being hereinafter referred to as a second integer sequence; and
   transmit the second integer sequence to an application for processing.

3. An encoding apparatus comprising the converting apparatus according to claim 1 or 2, and processing circuitry configured to: execute an integer encoding processing, wherein the integer encoding processing encodes the second integer sequence obtained by the converting apparatus according to a variable-length reversible encoding rule under which codes with the same bit number may be assigned to a plurality of non-negative integer values but a code with a smaller bit number is never assigned to a larger value among the plurality of non-negative integer values, and obtains an integer code.

4. The encoding apparatus according to claim 3, wherein the first integer sequence is a sequence of non-negative integer values corresponding to each of the prescribed samples included in a sequence of non-negative integer values input to the encoding apparatus, the encoding apparatus further comprising processing circuitry configured to: execute a parameter determining processing that, each for the first integer sequence, obtains a Golomb parameter s' for integer encoding as the inverse of a Golomb parameter s corresponding to non-negative integer values included in the first integer sequence, and a parameter code corresponding to the Golomb parameter s' for integer encoding, and the integer encoding processing subjects the second integer sequence obtained by the converting apparatus to Golomb coding by using the Golomb parameter s' for integer encoding obtained by the parameter determining processing as the Golomb parameter and obtains an integer code.

5. The encoding apparatus according to claim 3, wherein the first integer sequence is a sequence of non-negative integer values corresponding to each of the prescribed samples included in a sequence of non-negative integer values input to the encoding apparatus, the encoding apparatus further comprising processing circuitry configured to: execute a parameter determining processing that, each for the first integer sequence, obtains a Golomb parameter s corresponding to non-negative integer values included in the first integer sequence, and a parameter code corresponding to the Golomb parameter s, and the integer encoding processing subjects the second integer sequence obtained by the converting apparatus to Golomb coding by using the inverse of the Golomb parameter s obtained by the parameter determining processing as a Golomb parameter and obtains an integer code.

6. The encoding apparatus according to claim 3, further comprising processing circuitry configured to: execute a parameter determining processing that, for each of the prescribed samples included in a sequence of non-negative integer values input to the encoding apparatus, obtains a Golomb parameter s corresponding to non-negative integer values included in a sequence of non-negative integer values for the prescribed samples, the sequence of non-negative integer values for the prescribed samples being referred to as an input integer sequence and a parameter code corresponding to the Golomb parameter s, wherein, when the Golomb parameter s is less than 1, the converting apparatus obtains the second integer sequence by using the input integer sequence as the first integer sequence, the integer encoding processing subjects the second integer sequence to Golomb coding by using the inverse of the Golomb parameter s obtained by the parameter determining processing as a Golomb parameter, to obtain an integer code, and, when the Golomb parameter s is at least 1, the integer encoding processing subjects the input integer sequence to Golomb coding by using the Golomb parameter s obtained by the parameter determining processing as a Golomb parameter, to obtain an integer code.

7. A non-transitory computer-readable storage medium which stores a program for causing a computer to function as the encoding apparatus according to claim 3.

8. A decoding apparatus comprising: the converting apparatus according to claim 1 or 2; and processing circuitry configured to: execute an integer decoding processing, wherein the integer decoding processing decodes an input integer code to obtain a sequence of non-negative integer values according to a variable-length reversible decoding rule under which different non-negative integer values may be obtained from a plurality of codes with the same bit number but a non-negative integer value obtained from a code with a larger bit number among a plurality of codes with different bit numbers is always larger than a non-negative integer value obtained from a code with a smaller bit number, and the converting apparatus obtains the second integer sequence by using the sequence of non-negative integer values obtained by the integer decoding processing as the first integer sequence.

9. The decoding apparatus according to claim 8, further comprising processing circuitry configured to: execute a parameter decoding processing that decodes a parameter code to obtain a Golomb parameter s, wherein, when the Golomb parameter s is less than 1, the integer decoding processing subjects an input integer code to Golomb decoding by using the inverse of the Golomb parameter s obtained by the parameter decoding processing as a Golomb parameter, to obtain a sequence non-negative integer values, the converting apparatus obtains the second integer sequence by using the sequence of non-negative integer values obtained by the integer decoding processing as the first integer sequence, and outputs the obtained second integer sequence as a decoded integer sequence, and, when the Golomb parameter s is at least 1, the integer decoding processing subjects the input integer code to Golomb decoding by using the Golomb parameter s obtained by the parameter decoding processing as a Golomb parameter, to obtain a sequence of non-negative integer values, and outputs the obtained sequence of non-negative integer values as a decoded integer sequence.

10. A non-transitory computer-readable storage medium which stores a program for causing a computer to function as the decoding apparatus according to claim 8.

11. A non-transitory computer-readable storage medium which stores a program for causing a computer to function as the converting apparatus according to claim 1 or 2.

12. A converting method for executing:
a retrieving step of retrieving an input signal from a memory, wherein the input signal includes an input sequence of non-negative integer values;
a unary coding step in which a converting apparatus subjects the input sequence of non-negative integer values to unary coding to obtain a unary code sequence, the input sequence of non-negative integer values being hereinafter referred to as a first integer sequence;
a bit reversing step in which, based on a bit-by-bit operation, the converting apparatus replaces a bit value '0' with a bit value '1' and a bit value '1' with a bit value '0' in the bits in the unary code sequence to obtain a replaced code sequence;
a unary decoding step in which the converting apparatus subjects the replaced code sequence to unary decoding to obtain a sequence of non-negative integer values, the sequence of non-negative integer values being hereinafter referred to a second integer sequence; and
a transmitting step of transmitting the second integer sequence to an application configured for processing.

13. A converting method for executing:
a retrieving step of retrieving an input signal from a memory, wherein the input signal includes an input sequence of non-negative integer values;
a unary coding step in which a converting apparatus subjects the input sequence of non-negative integer values to unary coding to obtain a unary code sequence, the input sequence of non-negative integer values being hereinafter referred to as a first integer sequence;
a unary decoding step in which the converting apparatus subjects the unary code sequence to unary decoding according to a rule under which, based on a bit-by-bit operation, a bit value '0' and a bit value '1' are reversed from the unary coding in the unary coding step, to obtain a sequence of non-negative integer values, the sequence of non-negative integer values being hereinafter referred to as a second integer sequence; and
a transmitting step of transmitting the second integer sequence to an application configured for processing.

14. An encoding method for executing: an integer encoding step performed by an encoding apparatus, the encoding apparatus including the converting apparatus that performs the converting method according to claim 12 or 13, wherein in the integer encoding step, the second integer sequence obtained by the converting method is encoded according to a variable-length reversible encoding rule under which codes with the same bit number may be assigned to a plurality of non-negative integer values but a code with a smaller bit number is never assigned to a larger value among the plurality of non-negative integer values, to obtain an integer code.

15. A decoding method for executing: an integer decoding step performed by a decoding apparatus, the decoding apparatus including the converting apparatus that performs the converting method according to claim 12 or 13, wherein, in the integer decoding step, an input integer code is decoded according to a variable-length reversible decoding rule under which different non-negative integer values may be obtained from a plurality of codes with the same bit number but a non-negative integer value obtained from a code with a larger bit number among a plurality of codes with different bit numbers is always larger than a non-negative integer value obtained from a code with a smaller bit number, to obtain a sequence of non-negative integer values, and in the converting method, the second integer sequence is obtained by using the sequence of non-negative integer values obtained in the integer decoding step as the first integer sequence.

* * * * *